US012794457B2

(12) United States Patent
Sabada et al.

(10) Patent No.: US 12,794,457 B2
(45) Date of Patent: Nov. 10, 2026

(54) METHODS AND APPARATUS TO PERFORM CLOCK GATING

(71) Applicant: Texas Instruments Incorporated, Dallas, TX (US)

(72) Inventors: Gokul Sabada, Bangalore (IN); Arnab Khawas, Bangalore (IN); Badarish Subbannavar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 53 days.

(21) Appl. No.: 18/583,492

(22) Filed: Feb. 21, 2024

(65) Prior Publication Data

US 2025/0266813 A1 Aug. 21, 2025

(51) Int. Cl.

*H03K 3/3562* (2006.01)
*H03K 3/012* (2006.01)
*H03K 19/0185* (2006.01)
*H03K 19/094* (2006.01)

(52) U.S. Cl.

CPC ......... *H03K 3/35625* (2013.01); *H03K 3/012* (2013.01); *H03K 19/018521* (2013.01); *H03K 19/09425* (2013.01)

(58) Field of Classification Search

CPC ............... H03K 3/35625; H03K 3/012; H03K 19/018521; H03K 19/09425

See application file for complete search history.

(56) References Cited

U.S. PATENT DOCUMENTS 10,944,401 B1 * 3/2021 Kim ................... H03K 19/0016
2014/0184271 A1 * 7/2014 Gurumurthy ...... H03K 19/0016 326/93
2019/0028091 A1 * 1/2019 Baratam ................ H03K 3/012
2021/0135659 A1 * 5/2021 Lee ....................... G06F 1/3287
2021/0226615 A1 * 7/2021 Rasouli ..................... G06F 1/10

* cited by examiner

*Primary Examiner* — Sibin Chen
(74) *Attorney, Agent, or Firm* — Michelle F. Murray; Charles F. Koch

(57) ABSTRACT

Methods, apparatus, and systems are described to perform clock gating. An example apparatus to perform clock gating includes a first transistor; a second transistor including a first terminal and a second terminal, the first terminal of the second transistor coupled to a first terminal of the first transistor, the second terminal of the second transistor coupled to a second terminal of the first transistor; an inverter including an input terminal coupled to the first terminal of the first transistor and the first terminal of the second transistor; and a tristate inverter including an input terminal and an output terminal, the input terminal of the tristate inverter coupled to an output terminal of the inverter, the output terminal of the tristate inverter coupled to the input terminal of the inverter, the first terminal of the first transistor, and the first terminal of the second transistor.

20 Claims, 6 Drawing Sheets

METHODS AND APPARATUS TO PERFORM CLOCK GATING

TECHNICAL FIELD

This description relates generally to circuits, and, more particularly, to methods and apparatus to perform clock gating.

BACKGROUND

Computing devices may include one or more electrical components that utilize a local clock signal that is based on a master clock signal to perform functions. For example, a processing circuit may execute instructions based on a local clock signal (e.g., the processing circuitry executes each instruction based on each clock pulse of the local clock signal). To improve power consumption, performance, and reliability of the computing device, clock gating circuitry can be used to selectively disable the transitions of the master clock signal to generate a local clock signal provided to one or more components (e.g., while the one or more components are not being used). Clock gating circuitry gates (e.g., blocks, disables, etc.) the transitions of the master clock signal so that the one or more components do not obtain the transitions of the master clock signal, thereby pausing or disabling operation of the one or more components.

SUMMARY

An example of the description includes an apparatus which includes a first transistor including a control terminal, a first terminal, and a second terminal. The apparatus also includes a second transistor including a control terminal, a first terminal, and a second terminal, the first terminal of the second transistor coupled to the first terminal of the first transistor, the second terminal of the second transistor coupled to the second terminal of the first transistor. The apparatus also includes an inverter including an input terminal and an output terminal, the input terminal of the inverter coupled to the first terminal of the first transistor and the first terminal of the second transistor. The apparatus also includes a tristate inverter including an input terminal and an output terminal, the input terminal of the tristate inverter coupled to the output terminal of the inverter, the output terminal of the tristate inverter coupled to the input terminal of the inverter, the first terminal of the first transistor, and the first terminal of the second transistor. The apparatus also includes a logic and gate including a first input terminal, a second input terminal, and an output terminal, the first input terminal of the logic and gate coupled to the output terminal of the inverter and the input terminal of the tristate inverter, and the second input terminal coupled to clock generation circuitry.

Another example apparatus includes a first p-channel transistor including a control terminal, a first terminal, and a second terminal, the control terminal of the first p-channel transistor coupled to clock generation circuitry, the first terminal of the first p-channel transistor coupled to a supply voltage terminal. The apparatus also includes a second p-channel transistor including a control terminal, a first terminal, and a second terminal, the control terminal of the second p-channel transistor coupled to clock control circuitry via a first connection, the first terminal of the second p-channel transistor coupled to the second terminal of the first p-channel transistor. The apparatus also includes a first transistor including a control terminal, a first terminal, and a second terminal, the control terminal of the first transistor coupled to the clock control circuitry via the first connection, the first terminal of the first transistor coupled to the second terminal of the second p-channel transistor, the second terminal of the first transistor coupled to a ground terminal. The apparatus also includes a second transistor including a control terminal, a first terminal, and a second terminal, the control terminal of the second transistor coupled to the clock generation circuitry, the first terminal of the second transistor coupled to the second terminal of the second p-channel transistor and the first terminal of the first transistor, the second terminal of the second transistor coupled to the ground terminal. The apparatus also includes an inverter including an input terminal and an output terminal, the input terminal of the inverter coupled to the second terminal of the second p-channel transistor, the first terminal of the first transistor, and the first terminal of the second transistor.

Another example apparatus includes a first transistor including a control terminal, a first terminal, and a second terminal. The apparatus also includes a second transistor including a control terminal, a first terminal, and a second terminal, the first terminal of the second transistor coupled to the first terminal of the first transistor, the second terminal of the second transistor coupled to the second terminal of the first transistor. The apparatus also includes a first p-channel transistor including a control terminal, a first terminal, and a second terminal, the control terminal of the first p-channel transistor coupled to the first terminal of the first transistor and the first terminal of the second transistor, the first terminal of the first p-channel transistor coupled to a supply terminal. The apparatus also includes a third transistor including a control terminal, a first terminal, and a second terminal, the control terminal of the third transistor coupled to the first terminal of the first transistor, the first terminal of the second transistor, and the control terminal of the first p-channel transistor, the first terminal of the third transistor coupled to the second terminal of the first p-channel transistor, the second terminal of the third transistor coupled to a ground terminal. The apparatus also includes a second p-channel transistor including a control terminal, a first terminal, and a second terminal, the control terminal of the second p-channel transistor coupled to the second terminal of the first p-channel transistor and the first terminal of the third transistor, the first terminal of the second p-channel transistor coupled to a supply terminal. The apparatus also includes a third p-channel transistor including a control terminal, a first terminal, and a second terminal, the first terminal of the second p-channel transistor coupled to the second terminal of the second p-channel transistor, the second terminal of the third p-channel transistor coupled to the first terminal of the first transistor, the first terminal of the second transistor, the control terminal of the first p-channel transistor, and the control terminal of the third transistor. The apparatus also includes a fourth transistor including a control terminal, a first terminal, and a second terminal, the first terminal of the fourth transistor coupled to the second terminal of the third p-channel transistor, the first terminal of the first transistor, the first terminal of the second transistor, the control terminal of the first p-channel transistor, and the control terminal of the third transistor. The apparatus also includes a fifth transistor including a control terminal, a first terminal, and a second terminal, the control terminal of the fifth transistor coupled to the control terminal of the second p-channel transistor, the second terminal of the first p-channel transistor, and the first terminal of the third transistor, the first terminal of the fifth transistor coupled to the second terminal of the fourth transistor, the second terminal of the fifth transistor coupled to the ground terminal.

BRIEF DESCRIPTION OF THE DRAWINGS

The same reference numbers or other reference designators are used in the drawings to designate the same or similar (functionally or structurally) features.

DETAILED DESCRIPTION

Figure 1:
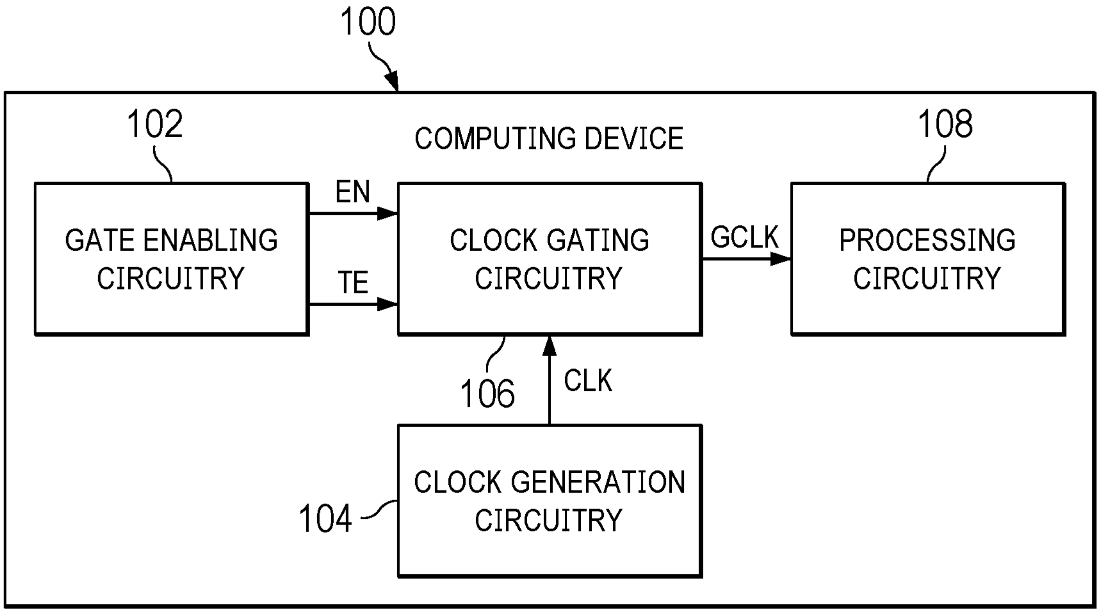
FIG. 1 is an example computing device described in conjunction with examples described herein.

The drawings are not necessarily to scale. Generally, the same reference numbers in the drawing(s) and this description refer to the same or like parts. Although the drawings show regions with clean lines and boundaries, some or all of these lines or boundaries may be idealized. In reality, the boundaries or lines may be unobservable, blended or irregular.

Microcontrollers or other circuitry are implemented in a variety of electronics to perform operations or tasks. Such controllers include processing circuitry (e.g., CPU core(s), GPU core(s), etc.) to facilitate the execution of instructions to perform the operations or tasks in conjunction with other peripheral devices (e.g., sensors, motors, keyboards, user interfaces, etc.). The processing circuitry, or other circuitry, may utilize a clock signal (e.g., a local clock signal that is based on a master clock signal) to execute the instructions. For example, the processing circuitry or memory uses the local clock signal to coordinate operations. Thus, circuits can include, or be connected to, one or more clock oscillators that generate the master clock signal(s) that the processing circuitry uses to execute instructions and/or perform operations.

However, even if circuitry that relies on a local clock signal is not being used, or is not being used frequently or consistently, the circuitry continues to consume power based on the received local clock signal if the local clock signal continues to oscillate. Conversely, if the clock signal stops oscillating, the circuitry conserves power. Accordingly, to preserve power, clock gating circuitry is implemented to gate (e.g., block, remove, etc.) the pulses of a master clock from producing pulses in a local clock signal provided to the circuitry the circuitry is not in use.

In some examples, the timing of the clock gating to avoid producing clock glitches may be more important for particular circuitry or applications than others. In such circuitry or applications, high performance clock gating circuits are used. High performance clock gating circuits improve performance by reducing the number of transistors in the clock gating path to increase speed and decrease path impedance. However, high performance clock gating circuitry requires more components leading to larger area overhead. Examples described herein provide example high performance clock gating circuits while reducing the number of components or area overhead to implement, thereby conserving power and space and reducing complexity.

FIG. 1 illustrates an example computing device 100. The computing device 100 may be a microcontroller or another controller device, including any semiconductor device or integrated circuit such as a power management integrated circuit. The example computing device 100 includes example clock control circuitry 102, example clock generation circuitry 104, example clock gating circuitry 106, and example processing circuitry 108.

Clock generation circuitry 104 produces a master clock signal (e.g., clk) that is distributed throughout the computing devices. The master clock signal is received by a set of local clock generators that each use the master clock signal and a set of control signals to generate a local clock signal (e.g., gateable local clock: gclk).

In that regard, the clock control circuitry 102 of FIG. 1 is logic circuitry that determines whether to gate the pulses of the master clock signal to prevent transitions in the local clock of the processing circuitry 108. For example, the clock control circuitry 102 may cause the clock gating circuitry 106 to gate the master clock signal at particular points in time, based on utilizing of the processing circuitry 108, based on user or manufacturer preferences, etc. If the clock gating circuitry 106 is to gate the master clock signal, the clock control circuitry 102 outputs a first voltage (e.g., a logic low voltage) on the enable terminal (EN) and the test enable terminal (TE). To pass the master clock signal to processing circuitry 108, the clock control circuitry 102 outputs a second voltage (e.g., a logic high voltage) to the clock gating circuitry 106 via the EN terminal or the TE terminal. In the example of FIG. 1, the first voltage on the EN terminal is to gate the master clock signal during normal operation and the first voltage on the TE terminal is to gate the master clock signal during test operation. However, there may be only one terminal or any number of terminals for clock gating during any mode of operation. In some examples, the clock control circuitry 102 may include two circuits, a first clock control circuit to trigger enabling during normal operation and a second clock control circuit to trigger enabling during test operation.

As described above, the clock generation circuitry 104 of FIG. 1 generates one or more master clock signals. The clock generation circuitry 104 may include one or more oscillators to generate the one or more master clock signals. The clock generation circuitry 104 outputs the generated master clock signal to the clock gating circuitry 106. In this manner, the clock gating circuitry 106 can determine whether to provide the local clock signal to the processing circuitry 108 based on the pulses of the master clock signal or to gate the master clock signal (e.g., based on the signal(s) from the clock control circuitry 102), as further described below.

The clock gating circuitry 106 of FIG. 1 obtains the master clock signal generated by the clock generation circuitry 104. If the clock control circuitry 102 outputs an instruction (e.g., based on the signal or voltage output on the EN and TE terminals) not to gate the master clock signal, the clock gating circuitry 106 outputs the gated local clock signal to the processing circuitry 108. If the clock control circuitry 102 obtains an instruction to gate the master clock signal, the clock gating circuitry 106 gates (e.g., blocks, discards, or otherwise does not provide) the transitions in the master clock signal from producing transitions in the local clock signal provided to the processing circuitry 108. In the examples described herein, the clock gating circuitry 106 is a low latch enabling circuit. A low latch enabling circuit latches the output of the clock gating circuitry 106 until the master clock signal is a logic low voltage. Accordingly, if the at least one of the voltage at the EN or TE terminal is a logic high voltage, the clock gating circuitry 106 will pass the transitions in the master clock signal as transitions in the local clock signal to the processing circuitry 108. If both of the voltages at the EN and TE terminal become a logic low voltage, the clock gating circuitry 106 will not start clocking the local clock signal until the master clock signal reaches a logic low voltage. Likewise, when at least one of the voltages at EN or TE terminals returns to a logic high voltage, the clock gating circuitry 106 will not start passing the transitions in the master clock signal until the master clock signal reaches a logic low voltage. As further described above, the clock gating circuitry 106 is high performance clock gating circuitry with less components than some high-performance clock gating circuitry. An example circuit implementation of the clock gating circuitry 106 is further described below in conjunction with FIGS. 2, 3, 5, and 6.

The processing circuitry 108 of FIG. 1 is circuitry that executes instructions based on the local clock signal. Thus, the processing circuitry 108 relies on the local clock signal to execute the instructions. For example, if the clock gating circuitry 106 passes the transitions in the master clock signal from the clock generation circuitry 104 to the processing circuitry 108, the processing circuitry 108 executes the instructions. However, if the clock gating circuitry 106 gates the master clock signal from the clock generation circuitry 104, the processing circuitry 108 does not execute instructions. As described above, the clock gating circuitry 106 may gate the master clock signal to conserve power that normally would be consumed by the processing circuitry 108 while the local clock signal is transitioning. Although FIG. 1 includes the processing circuitry 108, the processing circuitry 108 may be replaced with any circuitry or component that utilizes a local clock signal for operation.

Although the example of FIG. 1 includes the clock control circuitry 102, the clock generation circuitry 104, the clock gating circuitry 106, and the processing circuitry 108, there may be any number of clock gating circuitry connected to any number of clock control circuitry, clock generation circuitry, or processing circuitry. For example, if the computing device 100 is implementing three processing circuitry that can all be independently clock gated, there may be three or more clock control circuitry for the three separate processing circuitry, and one to three clock gating circuitry to independently control the local clock signals to the three processing circuitry. Accordingly, any number or combination of one or more clock control circuitry, clock gating circuitry, block generation circuitry, or processing circuitry may be implemented in the computing device 100.

Figure 2:
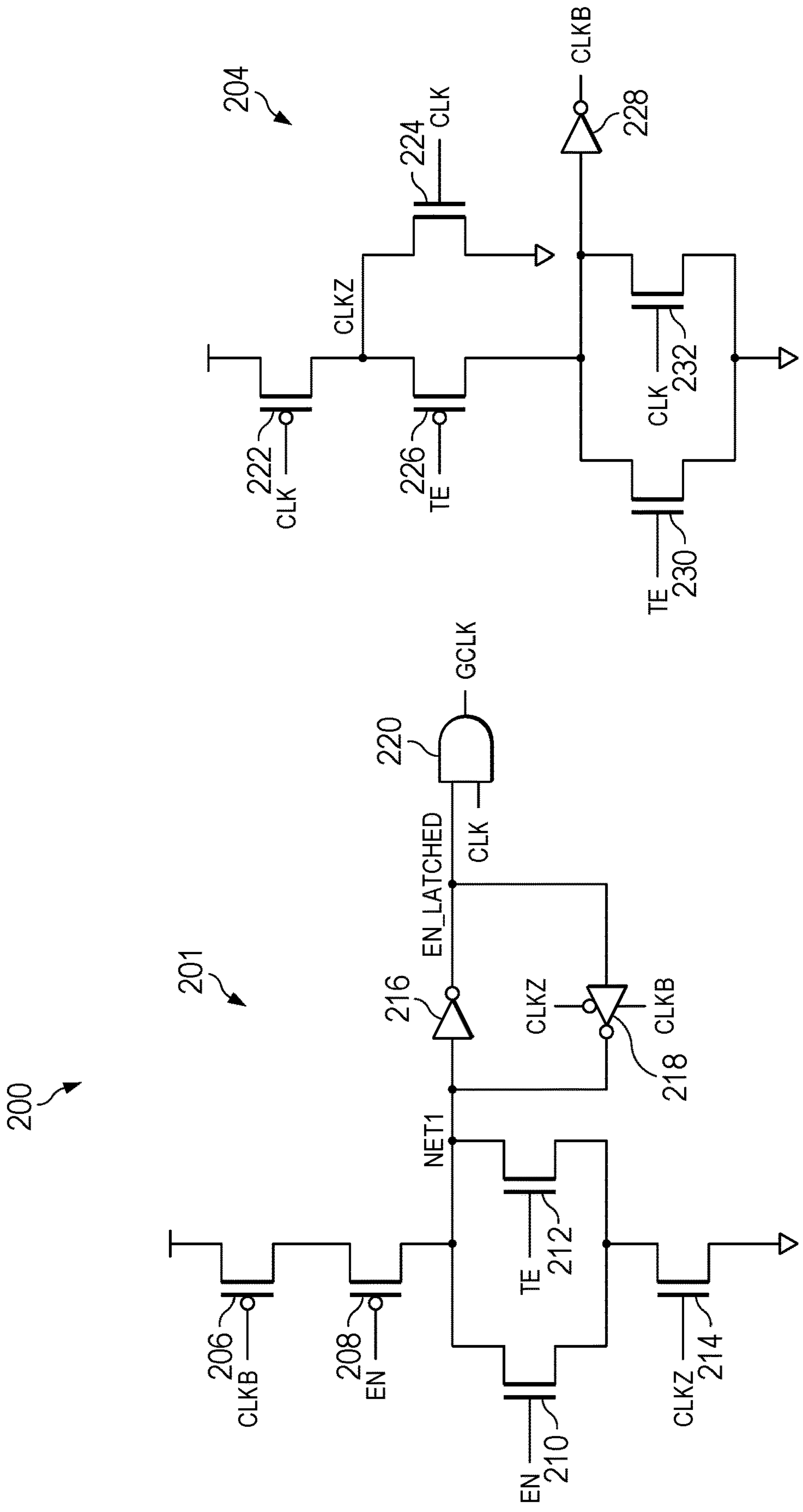
FIG. 2 is a logic-gate level circuit diagram of the clock gating circuitry of FIG. 1.

FIG. 2 is an example circuit implementation of the clock gating circuitry 106 of FIG. 1. The example clock gating circuitry 200 of FIG. 2 includes an example gating portion 201 and an example clock signal generation portion 204. The gating portion 201 includes example transistors 206, 208, 210, 212, 214, an example inverter 216, an example tristate inverter 218, and a logic gate 220. The clock signal generation portion 204 includes the example transistors 222, 224, 226, 230, 232 and the example inverter 228.

The transistors 206, 208 of FIG. 2 are p-channel transistors (e.g., p-channel metal oxide semiconductor (PMOS) field effect transistors (FETs)) connected in series. The transistors 206, 208 each include a control terminal and two current terminals. As used herein, the control terminal of a PMOS transistor is the gate terminal, the first current terminal of a PMOS transistor is a source terminal, and the second current terminal of a PMOS transistor is a drain terminal. The control terminal of the transistor 206 is coupled to the output terminal of the inverter 228 via the CLKB terminal. The first current terminal of the transistor 206 is coupled to a supply voltage terminal. The second current terminal of the transistor 206 is coupled to the first current terminal of the transistor 208. The control terminal of the transistor 208 is coupled to the clock control circuitry 102 via the EN terminal. The first current terminal of the transistor 208 is coupled to the second current terminal of the transistor 206. The second current terminal of the transistor 208 is coupled to the first current terminals of the transistors 210, 212, the output terminal of the tristate inverter 218, and the input of the inverter 216 via the NET1 terminal. The transistors 206, 208 operate as switches (e.g., voltage controlled current switches). For example, if the voltage at the control terminal of the transistor 206 is a logic low voltage (e.g., 0 Volts (V)), the transistor 206 is enabled and operates as a closed switch to short the connection from the first current terminal of the transistor 206 to the second current terminal of the transistor 206. Also, if the voltage at the control terminal of the transistor 206 is a logic high voltage (e.g., 5 Volts (V)), the transistor 206 is disabled and operates as an open switch to open/disconnect the connection from the first current terminal of the transistor 206 to the second current terminal of the transistor 206. Likewise, if the voltage at the control terminal of the transistor 208 is a logic low voltage (e.g., 0 Volts (V)), the transistor 208 is enabled and operates as a closed switch to short the connection from the first current terminal of the transistor 208 to the second current terminal of the transistor 208. Also, if the voltage at the control terminal of the transistor 208 is a logic high voltage (e.g., 5 Volts (V)), the transistor 208 disables and operates as an open switch to open/disconnect the connection from the first current terminal of the transistor 208 to the second current terminal of the transistor 208. Accordingly, if both the transistors 206, 208 are enabled (e.g., the voltage at the EN and CLKB terminals are logic low voltages), the voltage at the input terminal of the inverter 216 is a logic high voltage, because both transistors 206, 208 operate as closed switches to provide a path between the supply voltage and the input of the inverter 216.

The transistors 210, 212, 214 of FIG. 2 are n-channel transistors (e.g., p-channel metal oxide semiconductor (NMOS) field effect transistors (FETs)). The transistors 210, 212 are connected in parallel. The transistors 210, 212, 214 each include a control terminal and two current terminals. As used herein, the control terminal of an NMOS transistor is the gate terminal, the first current terminal of an NMOS transistor is a drain terminal, and the second current terminal of an NMOS transistor is a source terminal. The control terminal of the transistor 210 is coupled to the clock control circuitry 102 via the EN terminal. The first current terminal of the transistor 210 is coupled to the second current terminal of the transistor 208, the first current terminal of the transistor 212, the output terminal of the tristate inverter 218, and the input of the inverter 216. The second current terminal of the transistor 210 is coupled to the second current terminal of the transistor 212 and the first current terminal of the transistor 214. The control terminal of the transistor 212 is coupled to the clock control circuitry 102 via the TE terminal. The first current terminal of the transistor 212 is coupled to the second current terminal of the transistor 208, the first current terminal of the transistor 210, the output terminal of the tristate inverter 218, and the input of the inverter 216. The second current terminal of the transistor 212 is coupled to the second current terminal of the transistor 210 and first current terminal of the transistor 214. The control terminal of the transistor 214 is coupled to the second current terminal of the transistor 222, the first current terminal of the transistor 224, and the first current terminal of the transistor 226. The first current terminal of the transistor 214 is coupled to the second current terminals of the transistors 210, 212. The second current terminal of the transistor 214 is coupled to a ground terminal. The transistors 210, 212, 214 operate as switches (e.g., voltage controlled current switches). For example, if the voltage at the control terminal of the transistor 210 is a logic high voltage (e.g., 5 Volts (V)), the transistor 210 is enabled and operates as a closed switch to short the connection from the first current terminal of the transistor 210 to the second current terminal of the transistor 210. Also, if the voltage at the control terminal of the transistor 210 is a logic low voltage (e.g., 0 Volts (V)), the transistor 210 is disabled and operates as an open switch to open/disconnect the connection from the first current terminal of the transistor 210 to the second current terminal of the transistor 210. Likewise, if the voltage at the control terminal of the transistor 212 is a logic high voltage (e.g., 5 Volts (V)), the transistor 212 is enabled and operates as a closed switch to short the connection from the first current terminal of the transistor 212 to the second current terminal of the transistor 212. Also, if the voltage at the control terminal of the transistor 212 is a logic low voltage (e.g., 0 Volts (V)), the transistor 212 disables and operates as an open switch to open/disconnect the connection from the first current terminal of the transistor 212 to the second current terminal of the transistor 212. Likewise, if the voltage at the control terminal of the transistor 214 is a logic high voltage (e.g., 5 Volts (V)), the transistor 214 is enabled and operates as a closed switch to short the connection from the first current terminal of the transistor 214 to the second current terminal of the transistor 214. Also, if the voltage at the control terminal of the transistor 214 is a logic low voltage (e.g., 0 Volts (V)), the transistor 214 disables and operates as an open switch to open/disconnect the connection from the first current terminal of the transistor 214 to the second current terminal of the transistor 214. Accordingly, if the transistor 214 and one or both of the transistors 210, 212 are enabled, the voltage at the input terminal of the inverter 216 is a logic low voltage, because the transistor 214 and one or both of the transistors 210, 212 operate as closed switches to provide a path between ground and the input of the inverter 216.

The inverter 216 (also referred to as a logic NOT gate) of FIG. 1 generates an output voltage that is the inverse of the input voltage. For example, if the voltage at the input terminal of the inverter 216 is a logic low voltage (e.g., 0 V), the inverter 216 outputs a logic high voltage (e.g., 5 V) at the output terminal, and, if the voltage at the input terminal of the inverter 216 is a logic high voltage (e.g., 5 V), the inverter 216 outputs a logic low voltage (e.g., 0 V) at the output terminal. The inverter 216 includes an input terminal and an output terminal. The input terminal of the inverter 216 is coupled to the second current terminal of the transistor 208 and the first current terminals of the transistor 210, 212, and the output terminal of the tristate inverter 218 via the NET1 terminal. The output terminal of the inverter 216 is coupled to the input terminal of the tristate inverter 218 and the first input terminal of the logic gate 220 via the EN_LATCHED terminal. As further described below, the clock gating circuitry 200 is an active low latch including the logic gate 220 (e.g., a logic AND gate). For example, the output of the inverter 216 will be a logic high voltage if either the voltage at the EN terminal or the voltage at the TE terminal is a logic high voltage after the master clock signal has gone to a logic low value. When the output of the inverter 216 is a logic high voltage, the logic gate 220 will pass the transitions of the master clock signal as to the processing circuitry 108 of FIG. 1 as transitions of the local clock signal. Also, the output of the inverter 216 will be a logic low voltage if both voltages at the EN terminal and the TE terminal are logic low voltages after the master clock signal has gone to a logic low voltage. When the output of the inverter 216 is a logic low voltage, the logic gate 220 will gate the master clock signal from the processing circuitry 108 of FIG. 1.

The tristate inverter 218 of FIG. 2 maintains the previous output logic gate from the functionality of the transistors 206, 208, 210, 212, 214, while both the transistor 206 and the transistor 214 are disabled. The tristate inverter 218 includes three input terminals and an output terminal. The first input terminal of the tristate inverter 218 is coupled to the output of the inverter 216 and the first input terminal of the logic gate 220. The second input terminal of the tristate inverter 218 is coupled to, via the CLKZ terminal, the second current terminal of the transistor 222 and the first current terminals of the transistors 224, 226. The third input terminal of the tristate inverter 218 is coupled to, via the CLKB terminal, the output terminal of the inverter 228. The output terminal of the tristate inverter 218 is coupled to the input terminal of the inverter 216, the second current terminal of the transistor 208, and the first current terminals of the transistors 210, 212 via the NET1 node. For each clock cycle, the tristate inverter 218 stores and holds the voltage output by the inverter 216 until the next clock cycle when the previously stored voltage is discarded and the new voltage is stored. In this manner, the inverter 218, when enabled, can output an inverted version of the previous voltage at the EN_LATCHED terminal. For example, if the tristate inverter 218 is enabled (e.g., when the CLKZ signal is a logic low voltage and the CLKB signal is a logic high voltage), the tristate inverter 218 outputs an inverted version of the input signal (e.g., a logic low to a logic high or a logic high to a logic low) at the output terminal. Also, the tristate inverter 218 is disabled and does not output a voltage if the voltage at the CLKZ is a logic high voltage of the voltage and the CLKB voltage is a logic low voltage. In this manner, if both transistors 206, 214 are disabled (e.g., if the voltage at the CLKZ voltage is low or the voltage at the CLKB voltage is high), the output of the tristate inverter 218, which corresponds to an inverted version of the previous voltage at the EN-LATCHED terminal when the voltage at the CLKZ terminal was a logic low voltage and the voltage at the CLKB terminal was a logic high voltage, can drive the input voltage of the inverter 216 because the supply voltage and the ground is decoupled from the input terminal of the inverter 216.

The logic gate 220 of FIG. 2 is a logic AND gate. The logic gate 220 includes two input terminals and an output terminal. The first input terminal of the logic gate 220 is coupled to the output terminal of the inverter 216 and the input terminal of the tristate inverter 218 via the EN_LATCHED terminal. The second input terminal of the logic gate 220 is coupled to the output terminal of the clock generation circuitry 104 via the CLK terminal. The logic gate 220 performs a logic AND function based on the voltages at the two input terminals. For example, if the voltage at both input terminals are logic high voltages, then the logic gate 220 outputs a logic high voltage. Otherwise, the logic gate 220 outputs a logic low voltage. Thus, if the master clock signal at the second input terminal of the logic gate 220 pulses between a logic low voltage and a logic high voltage, the logic gate 220 will output the master clock signal as the local clock signal if the voltage output by the inverter 216 is a logic high voltage. If the voltage output by the inverter 216 is a logic low voltage, the logic gate 220 will output a logic low voltage (e.g., discarding the transitions in the master clock signal). Accordingly, if the output of the inverter 216 is a logic high voltage, the logic gate 220 outputs the master clock signal to the processing circuitry 108 as the local clock signal and if the output of the inverter 216 is a logic low voltage, the logic gate 220 gates or blocks the transitions in the master clock signal from going to the processing circuitry 108.

The clock signal generation portion 204 of FIG. 2 generates the different clock signals based on the master clock signal from the clock generation circuitry 104. The master clock signal from the clock generation circuitry 104 is herein referred to as the CLK signal. The clock signal generation portion 204 uses the CLK signal from the clock generation circuitry 104 to generate a CLKZ signal and a CLKB signal. The CLKZ signal at the CLKZ terminal is CLK signal after being inverted. For example, if the CLK signal is a logic high voltage the CLKZ signal is a logic low voltage, and, if the CLK signal is a logic low voltage, the CLKZ signal is a logic high voltage. The CLKB signal at the CLKB terminal corresponds to a logic OR between the master clock signal at the CLK terminal and the test enable signal at the TE terminal. For example, if the master clock signal and the TE signal are logic low, the CLKB signal is a logic low voltage. Otherwise, the CLKB signal is a logic high voltage.

The transistors 222, 226 of FIG. 2 are p-channel transistors (e.g., p-channel metal oxide semiconductor (PMOS) field effect transistors (FETs)) connected in series. The transistors 222, 226 each include a control terminal and two current terminals. The control terminal of the transistor 222 is coupled to the clock generation circuitry 104 via the CLK terminal. The first current terminal of the transistor 222 is coupled to a supply voltage terminal. The second current terminal of the transistor 222 is coupled to the first current terminal of the transistor 226 and the first current terminal of the transistor 224 via the CLKZ terminal. The control terminal of the transistor 226 is coupled to the clock control circuitry 102 via the TE terminal. The first current terminal of the transistor 226 is coupled to the second current terminal of the transistor 222 and the first current terminal of the transistor 224 via the CLKZ terminal. The second current terminal of the transistor 226 is coupled to the first current terminals of the transistors 230, 232 and the input of the inverter 228. The transistors 222, 226 operate as switches (e.g., voltage controlled current switches). For example, if the voltage at the control terminal of the transistor 222 is a logic low voltage (e.g., 0 Volts (V)), the transistor 222 is enabled and operates as a closed switch to short the connection from the first current terminal of the transistor 222 to the second current terminal of the transistor 222. Also, if the voltage at the control terminal of the transistor 222 is a logic high voltage (e.g., 5 Volts (V)), the transistor 222 is disabled and operates as an open switch to open/disconnect the connection from the first current terminal of the transistor 222 to the second current terminal of the transistor 222. Likewise, if the voltage at the control terminal of the transistor 226 is a logic low voltage (e.g., 0 Volts (V)), the transistor 226 is enabled and operates as a closed switch to short the connection from the first current terminal of the transistor 226 to the second current terminal of the transistor 226. Also, if the voltage at the control terminal of the transistor 226 is a logic high voltage (e.g., 5 Volts (V)), the transistor 226 disables and operates as an open switch to open/disconnect the connection from the first current terminal of the transistor 226 to the second current terminal of the transistor 226. As described above, the signal at the CLKB node corresponds to logic OR of signal at the CLK node and the signal at the TE node. Also, the signal at the CLKZ node is inverted from the signal at the CLK node. The transistor 222 is common to the OR gate functionality corresponding to components 226, 230, 232, 228 and the inverter logic functionality corresponding to transistor 224.

The transistor 224 of FIG. 2 is an n-channel transistor. The transistor 224 includes a control terminal and two current terminals. The control terminal of the transistor 224 is coupled to the clock generation circuitry 104 via the CLK terminal. The first current terminal of the transistor 224 is coupled to the second current terminal of the transistor 222 and the first current terminal of the transistor 226. The second current terminal of the transistor 224 is coupled to the ground terminal. The transistor 224 operates as a switch (e.g., a voltage controlled current switch). For example, if the voltage at the control terminal of the transistor 224 is a logic high voltage (e.g., 5 Volts (V)), the transistor 224 is enabled and operates as a closed switch to short the connection from the first current terminal of the transistor 224 to the second current terminal of the transistor 224. Also, if the voltage at the control terminal of the transistor 224 is a logic low voltage (e.g., 0 Volts (V)), the transistor 224 is disabled and operates as an open switch to open/disconnect the connection from the first current terminal of the transistor 224 to the second current terminal of the transistor 224. Accordingly, if the transistor 226 is disabled (e.g., if the TE voltage is high) and the CLK signal is a high voltage, the transistor 222 is disabled and the transistor 224 is enabled, thereby causing the voltage at the CLKZ terminal to be a logic low value (e.g., because the CLKZ terminal is shorted to ground). Also, if the transistor 226 is disabled and the CLK signal is a low voltage, the transistor 222 is enabled and the transistor 224 is disabled, thereby causing the voltage at the CLKZ terminal to be a logic high value (e.g., because the CLKZ terminal is shorted to the supply voltage). Thus, the voltage at the CLKZ terminal is inverted from the voltage at the CLK terminal.

The transistors 230, 232 of FIG. 2 are n-channel transistors (e.g., p-channel metal oxide semiconductor (NMOS) field effect transistors (FETs)). The transistors 230, 232 are connected in parallel. The transistors 230, 232 each include a control terminal and two current terminals. The control terminal of the transistor 230 is coupled to the clock control circuitry 102 via the TE terminal. The first current terminal of the transistor 230 is coupled to the second current terminal of the transistor 226, the first current terminal of the transistor 232, and the input of the inverter 228. The second current terminal of the transistor 230 is coupled to the ground terminal. The control terminal of the transistor 232 is coupled to the clock generating circuitry 104 via the CLK terminal. The first current terminal of the transistor 232 is coupled to the second current terminal of the transistor 226, the first current terminal of the transistor 230, and the input of the inverter 228. The second current terminal of the transistor 230 is coupled to the ground terminal. The transistors 230, 232 operate as switches (e.g., voltage controlled current switches). For example, if the voltage at the control terminal of the transistor 230 is a logic high voltage (e.g., 5 Volts (V)), the transistor 230 is enabled and operates as a closed switch to short the connection from the first current terminal of the transistor 230 to the second current terminal of the transistor 230. Also, if the voltage at the control terminal of the transistor 230 is a logic low voltage (e.g., 0 Volts (V)), the transistor 230 is disabled and operates as an open switch to open/disconnect the connection from the first current terminal of the transistor 230 to the second current terminal of the transistor 230. Likewise, if the voltage at the control terminal of the transistor 232 is a logic high voltage (e.g., 5 Volts (V)), the transistor 232 is enabled and operates as a closed switch to short the connection from the first current terminal of the transistor 232 to the second current terminal of the transistor 232. Also, if the voltage at the control terminal of the transistor 232 is a logic low voltage (e.g., 0 Volts (V)), the transistor 232 disables and operates as an open switch to open/disconnect the connection from the first current terminal of the transistor 232 to the second current terminal of the transistor 232.

The inverter 228 (also referred to as a logic NOT gate) of FIG. 2 generates an output voltage that is the invert of the input voltage. For example, if the voltage at the input terminal of the inverter 228 is a logic low voltage (e.g., 0 V), the inverter 228 outputs a logic high voltage (e.g., 5 V) at the output terminal, and, if the voltage at the input terminal of the inverter 216 is a logic high voltage (e.g., 5 V), the inverter 228 outputs a logic low voltage (e.g., 0 V) at the output terminal. The inverter 228 includes an input terminal and an output terminal. The input terminal of the inverter 228 is coupled to the second current terminal of the transistor 226 and the first current terminals of the transistors 230, 232. The output terminal of the inverter 228 is coupled to the control terminal of the transistor 206 and the third input terminal of the tristate inverter 218 via the CLKB terminal. If the voltage at the TE terminal is a low voltage, the transistor 226 is enabled and the transistor 230 is disabled. Accordingly, the voltage at the input terminal of the inverter 228 is the CLKZ voltage. If the voltage at the TE terminal is a high voltage, the transistor 226 is disabled and the transistor 230 is enabled, the voltage at the input of the inverter 228 is a logic low voltage (e.g., because the input terminal of the inverter 228 is shorted to ground). Thus, the output of the inverter 228 is a logic high voltage.

In operation, if at least one of the EN voltage and the TE voltage is high voltage (indicative of no clock gating), the transistors 208, 226 are disabled and the transistors 210, 212, 230 are enabled. Thus, after the CLK and CLKB signals have reached a logic low voltage and the CLKZ signal has reached a logic high voltage, the voltage at the input terminal of the inverter 216 is a low voltage. In this manner, the output of the inverter 216 is a high voltage. Accordingly, the output of the logic gate 220 is the same as the master clock signal, thereby outputting the master clock signal to the processing circuitry 108 as the local clock signal. If both of the EN voltage and the TE voltage are a low voltage, the transistors 208, 226 are enabled and one or more of the transistors 210, 212, 230 are disabled. Thus, after the CLK and CLKB signals have reached a logic low voltage and the CLKZ signal has reached a logic high voltage, the voltage at the input terminal of the inverter 216 is a high voltage. In this manner, the output of the inverter 216 is a low voltage. Accordingly, the output of the logic gate 220 is a logic low voltage, thereby gating the transitions in the master clock signal from the processing circuitry 108. When the CLKZ signal is a logic low voltage and the CLKB signal is a logic high voltage, the tri state inverter 218 drives the inverter 216 by outputting an inverted version of the EN_LATCHED signal from a previous clock cycle. Thus, the clock gating circuitry 200 can only switch from gating the master clock signal to not gating the master clock signal after the master clock signal has transitioned from a logic high voltage to a logic low voltage. Accordingly, the clock gating circuitry 200 corresponds to a low latch enabling circuit.

Figure 3:
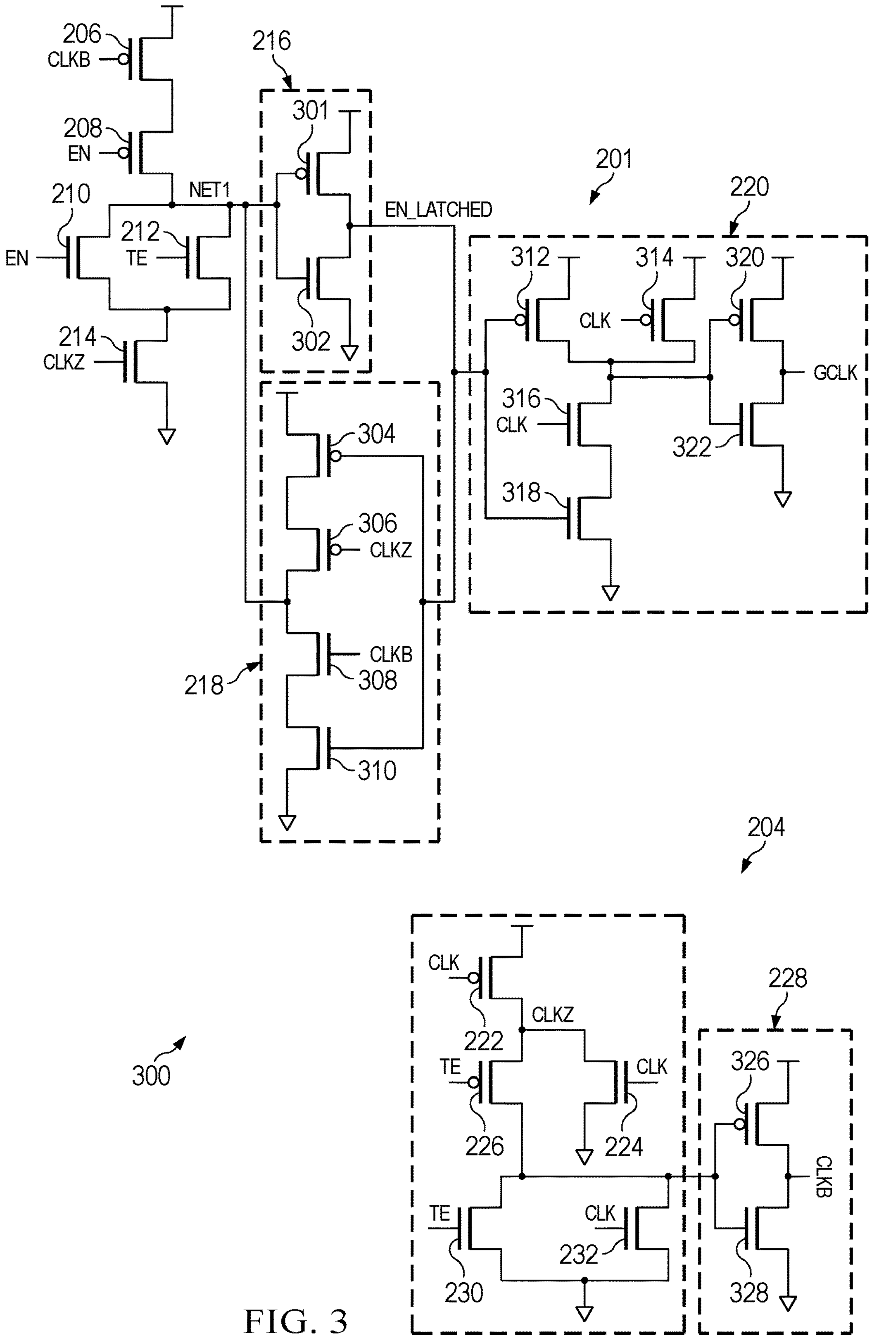
FIG. 3 is a transistor level circuit diagram of the clock gating circuitry of FIGS. 1 and 2.

FIG. 3 is a transistor-based circuit implementation of the clock gating circuitry 106, 200 of FIGS. 1-2. The clock gating circuitry 300 of FIG. 3 includes the gating portion 201, the clock signal generation portion 204, the example transistors 206, 208, 210, 212, 214, the example inverter 216, the example tristate inverter 218, the logic gate 220, the example transistors 222, 224, 226, 230, 232 and the example inverter 228 of FIG. 2. The inverter 216 of FIG. 3 includes the transistors 301, 302. The tristate inverter 218 of FIG. 3 includes transistors 304, 306, 308, 310. The logic gate 220 includes the transistors 312, 314, 316, 318, 320, 322. The inverter 228 includes the transistors 326, 328.

The transistor 301 of FIG. 3 is a p-channel transistor and the transistor 302 is an n-channel transistor coupled in parallel to implement the inverter 216 of FIG. 2. In operation, if the voltage at the control terminals of the transistors 301, 302 is a logic low voltage, the transistor 301 is enabled and the transistor 302 is disabled, thereby causing the output terminal of the inverter 216 to be a logic high voltage because the output terminal of the inverter 216 is coupled to the supply voltage. If the voltage at the control terminals of the transistors 301, 302 is a logic high voltage, the transistor 301 is disabled and the transistor 302 is enabled causing the output terminal of the inverter 216 to be a logic low voltage because the output terminal of the inverter 216 is coupled to the ground terminal. Each transistor 301, 302 includes a control terminal and two current terminals. The control terminal of the transistor 301 is coupled to the control terminal of the transistor 302, the second current terminal of the transistor 208, and the first current terminals of the transistors 210, 212. The first current terminal of the transistor 301 is coupled to a supply voltage terminal. The second current terminal of the transistor 301 is coupled to the first current terminal of the transistor 302, the control terminals of the transistors 304, 310, and the control terminals of the transistors 312, 318. The control terminal of the transistor 302 is coupled to the control terminal of the transistor 301, the second current terminal of the transistor 208, and the first current terminals of the transistors 210, 212. The first current terminal of the transistor 302 is coupled to the second current terminal of the transistor 301, the control terminals of the transistors 304, 310, and the control terminals of the transistors 312, 318. The second current terminal of the transistor 302 is coupled to the ground terminal.

The transistors 304, 306, 308, 310 of FIG. 3 are structured to implement the tristate inverter 218 of FIG. 2. For example, if the transistors 306, 308 are enabled, the output of the tristate inverter 218 is the opposite of the output of the inverter 216. The transistors 304, 306 are p-channel transistors and the transistors 308, 310 are n-channel transistors coupled in parallel. Each transistor 304, 306, 308, 310 includes a control terminal and two current terminals. The control terminals of the transistors 304, 310 are coupled the output terminal of the inverter 216 and the control terminals of the transistors 312, 318. The control terminal of the transistor 306 is coupled to the CLKZ terminal of the clock signal generation portion 204. The control terminal of the transistor 308 is coupled to the CLKB terminal of the clock signal generation portion 204. The first current terminal of the transistor 304 is coupled to the supply terminal. The second current terminal of the transistor 304 is coupled to the first current terminal of the transistor 306. The first current terminal of the transistor 306 is coupled to the second current terminal of the transistor 304. The second current terminal of the transistor 306 is coupled to the first current terminal of the transistor 308 and the NET1 terminal. The first current terminal of the transistor 308 is coupled to the second current terminal of the transistor 306 and the NET1 terminal. The second current terminal of the transistor 308 is coupled to the first current terminal of the transistor 310. The first current terminal of the transistor 310 is coupled to the second current terminal of the transistor 308. The second current terminal of the transistor 310 is coupled to the ground terminal.

The transistors 312, 314, 316, 318, 320, 322 of FIG. 3 are structured to implement the logic gate 220 of FIG. 2. The transistors 312, 314, 320 of FIG. 3 are p-channel transistors and the transistors 316, 318, 322 are n-channel transistors. Each transistor 312, 314, 316, 318, 320, 322 includes a control terminal and two current terminals. The control terminals of the transistors 312, 318 are coupled to each other, the inverter 216 and the tristate inverter 218, via the EN_LATCHED terminal. The control terminals of the transistors 316, 314 are coupled to the clock generation circuitry 104 via the CLK terminal. The control terminals of the transistors 320, 322 are coupled to each other and to the second control terminals of the transistors 312, 314 and the first current terminal of the transistor 316. The first current terminals of the transistors 312, 314, 320 are coupled to the supply terminal. The first current terminal of the transistor 316 is coupled to the second current terminals of the transistors 312, 314 and the control terminals of the transistors 320, 322. The first current terminal of the transistor 318 is coupled to the second current terminal of the transistor 316. The first current terminal of the transistor 322 is coupled to the second current terminal of the transistor 320 and the processing circuitry 108 via the GCLK terminal. The second current terminals of the transistor 312, 314 are coupled to each other, the first current terminal of the transistor 316 and the control terminals of the transistors 320, 322. The second current terminal of the transistor 316 is coupled to the first current terminal of the transistor 318. The second current terminal of the transistors 318, 322 are coupled to the ground terminal. The second current terminal of the transistor 320 is coupled to the first current terminal of the transistor 322 and the processing circuitry 108 via the GCLK terminal.

The transistor 326 of FIG. 3 is a p-channel transistor and the transistor 328 is an n-channel transistor coupled in parallel to implement the inverter 228 of FIG. 2. In operation, if the voltage at the control terminals of the transistors 326, 328 is a logic low voltage, the transistor 326 is enabled and the transistor 328 is disabled causing the output terminal of the inverter 228 to be a logic high voltage because the output terminal of the inverter 228 is coupled to the supply voltage. If the voltage at the control terminals of the transistors 326, 328 is a logic high voltage, the transistor 326 is disabled and the transistor 328 is enabled causing the output terminal of the inverter 228 to be a logic low voltage because the output terminal of the inverter 228 is coupled to the ground terminal. Each transistor 326, 328 includes a control terminal and two current terminals. The control terminal of the transistor 326 is coupled to the control terminal of the transistor 328, the second current terminal of the transistor 226, and the first current terminals of the transistors 230, 232. The first current terminal of the transistor 326 is coupled to a supply voltage terminal. The second current terminal of the transistor 326 is coupled to the first current terminal of the transistor 328 and the CLKB terminal of the gating portion 201. The control terminal of the transistor 328 is coupled to the control terminal of the transistor 326, the second current terminal of the transistor 226, and the first current terminals of the transistors 230, 232. The first control terminal of the transistor 328 is coupled to the second current terminal of the transistor 326 and the CLKB terminal of the gating portion 201. The second current terminal of the transistor 328 is coupled to the ground terminal.

Figure 4:
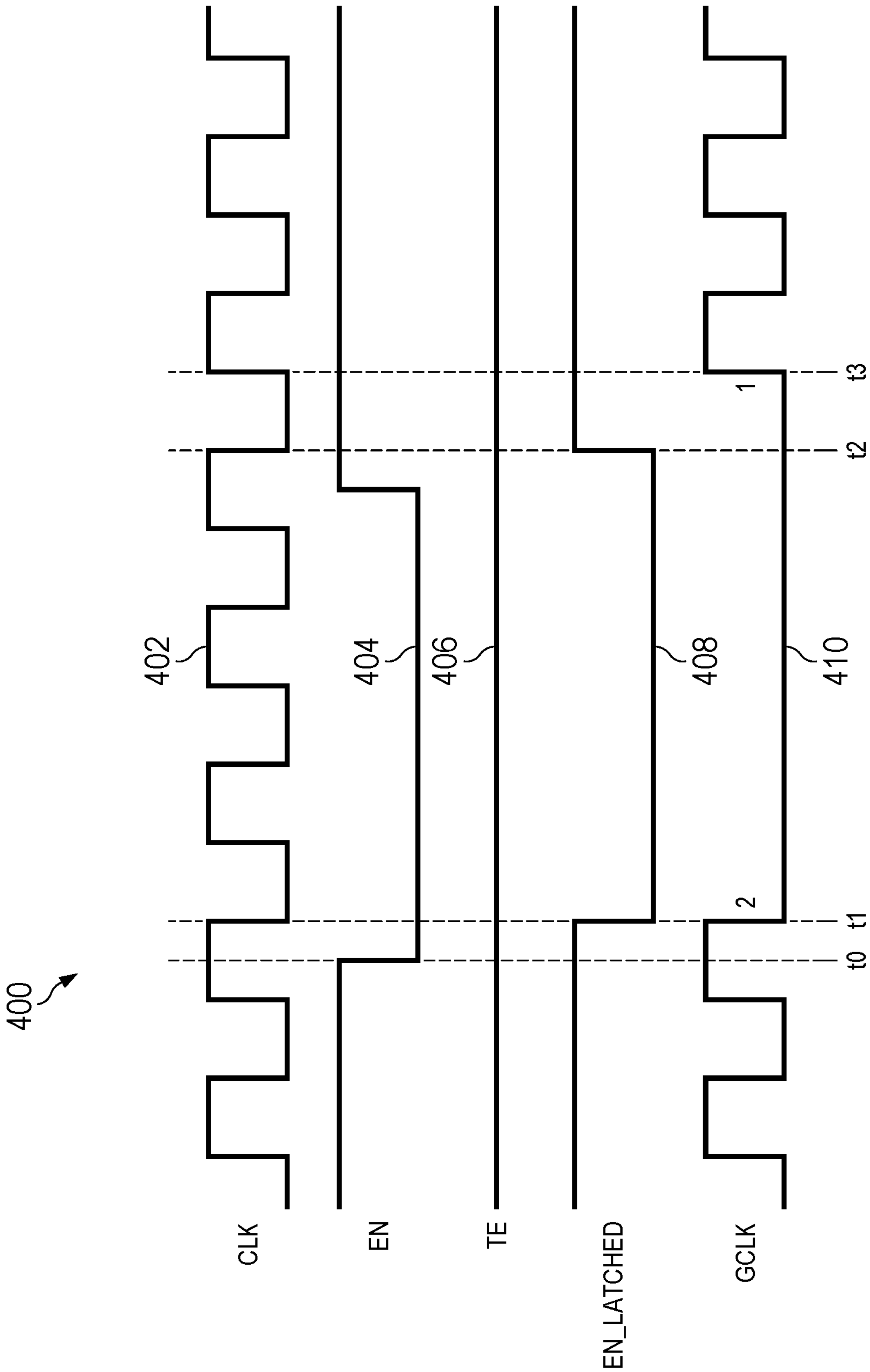
FIG. 4 is a timing diagram described in conjunction with the clock gating circuitry of FIGS. 2 and 3.

FIG. 4 is an example timing diagram 400 corresponding to signals at the nodes of the example clock gating circuitry 200, 300 of FIG. 2 or 3. The timing diagram 400 includes an example master clock signal 402, an example enable signal 404, an example test enable signal 406, an example enable latched signal 408, and an example gateable local clock signal 410. The master clock signal 402 corresponds to the master clock signal output by the clock generation circuitry 104 on the CLK terminal of FIGS. 1-3. The enable signal 404 corresponds to the enable signal output by the clock control circuitry 102 via the EN terminal of FIGS. 1-3. The test enable signal 404 corresponds to the test enable signal output by the clock control circuitry 102 via the TE terminal of FIGS. 1-3. The enable latched signal 408 corresponds to the signal output by the inverter 216 of FIGS. 2-3 via the EN_LATCHED terminal of FIGS. 2-3. The local clock signal 410 corresponds to the signal output by the logic gate 220 of FIGS. 2-3 via the GCLK terminal of FIGS. 1-3.

As shown in the example master clock signal 402 of FIG. 4, the master clock signal 402 pulses between a logic low voltage and a logic high voltage. Before time to, the enable signal 404 is a high voltage and the test enable signal 408 corresponds to a low voltage. Because the enable signal 404 is a high voltage before time to, no clock gating occurs. Thus, before time t0, the voltage at the enable latched signal 408 is a logic high and the master clock signal 402 is output/passed to the processing circuitry via the GCLK terminal, as shown in the local clock signal 410.

At time t0, the enable signal 404 drops from a logic high voltage to a logic low voltage. Also, the TE voltage is also a logic low voltage. However, at time t0, the master clock signal 402 is a high voltage. Thus, because the clock gating circuitry 200 is a low latch enabling circuit, the EN_LATCHED signal 408 will not drop to a low voltage until t1 when the master clock signal 402 drops to a low voltage. Accordingly, at time t1, the enable latched signal 408 drops from the logic high voltage to the logic low voltage. As described above, if the enable latched signal 408 drops to a logic low voltage, the logic gate 220 gates or blocks the master clock signal 402. Thus, between times t1 and t2, the master clock signal 402 is gated and the local clock signal 410 remains at a logic low voltage. Before time t2, the enable signal 404 returns to a logic high voltage. However, just before time t2, the master clock signal 402 is a high voltage. Accordingly, the EN-LATCH signal 408 will not increase to a high voltage until after the master clock signal 402 drops to a low voltage because clock gating circuitry 200 is a low latch enabling circuit. Thus, at time t2, after the master clock signal 402 drops to a low voltage, the enable latched signal 408 increases from the logic low voltage to the logic high voltage. As described above, if the enable latched signal 408 increases to a logic high voltage, the logic gate 220 passes the master clock signal 402. However, because between times t2 and t3 the master clock signal 402 is a logic low voltage, the local clock signal 410 is also a logic low voltage. After time t2, the local clock signal 410 is the same as the master clock signal 402. Although the example of FIG. 4 shows a particular pattern for the enable signal 404, and the test enable signal 406, FIG. 4 could be described in conjunction with any enable or test enable pattern.

Figure 5:
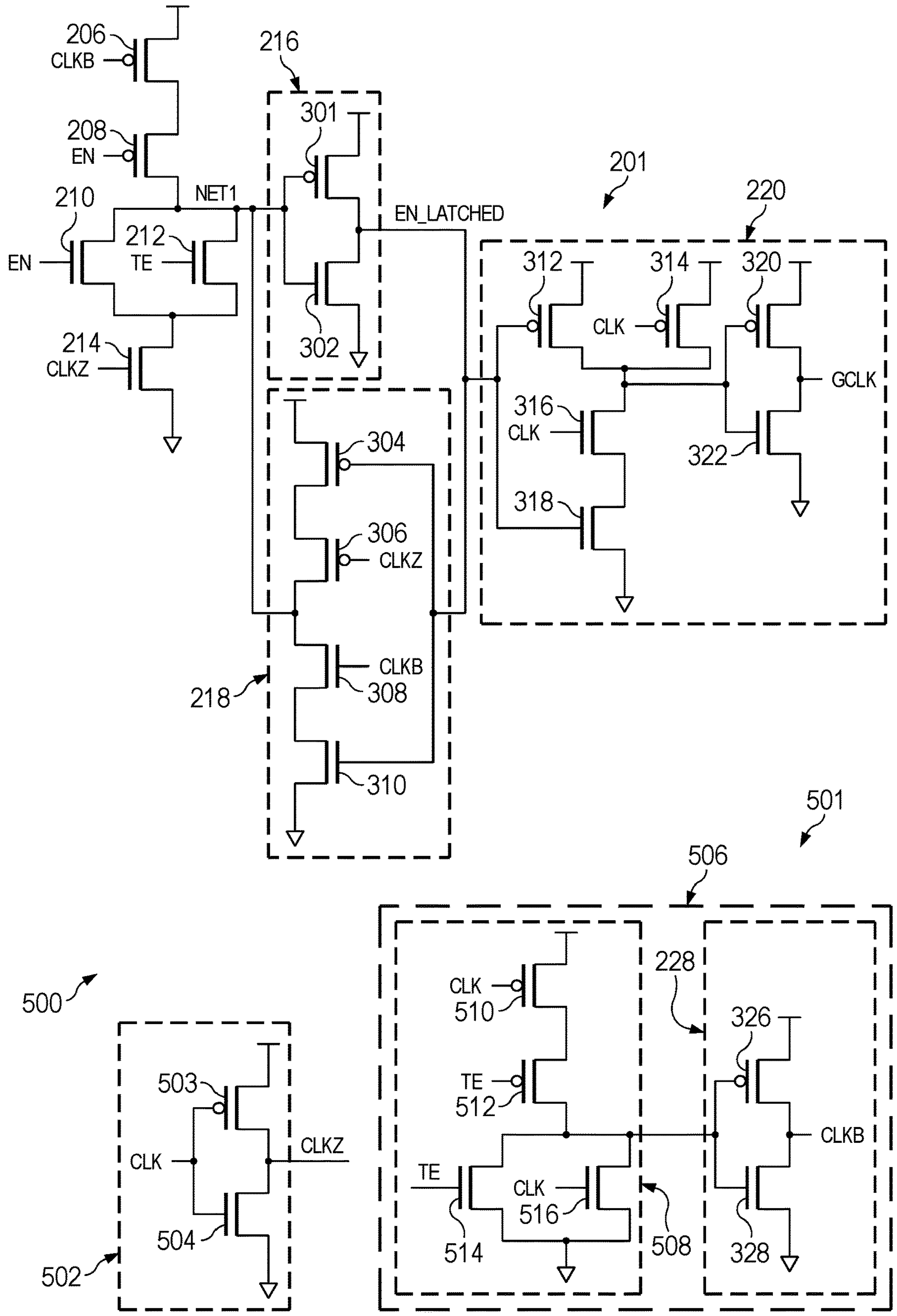
FIG. 5 is an alternative level circuit diagram of the clock gating circuitry of FIG. 1.

FIG. 5 illustrates an alternative circuit implementation of the clock gating circuitry 106 of FIG. 1. The example clock gating circuitry 500 of FIG. 5 includes the gating portion 201 of FIGS. 2 and 3. However, in FIG. 5, the clock signal generation portion 204 of FIGS. 2 and 3 is replaced with an alternative example clock signal generation portion 501. The example clock signal generation portion 501 includes an example inverter 502 including transistor 503, 504, an example logic gate 506 including an example logic gate 508 and the inverter 228 of FIGS. 2 and 3. The logic gate 508 includes transistors 510, 512, 514, 516.

The inverter 502 of FIG. 5 inverts the master clock signal from the clock generation circuitry 104 at the CLK terminal to generate the inverted clock signal at the CLKZ terminal. The inverter 502 includes an input terminal coupled to the clock generation circuitry 104 and an output terminal coupled to the CLKZ terminal.

The transistor 503 of FIG. 5 is a p-channel transistor and the transistor 504 is an n-channel transistor coupled in parallel to implement the inverter 502 of FIG. 5. In operation, if the voltage at the control terminals of the transistors 503, 504 is a logic low voltage, the transistor 503 is enabled and the transistor 504 is disabled causing the output terminal of the inverter 502 to be a logic high voltage because the output terminal of the inverter 502 is coupled to the supply voltage. If the voltage at the control terminals of the transistors 503, 504 is a logic high voltage, the transistor 503 is disabled and the transistor 504 is enabled causing the output terminal of the inverter 502 to be a logic low voltage because the output terminal of the inverter 502 is coupled to the ground terminal. Each transistor 503, 504 includes a control terminal and two current terminals. The control terminal of the transistor 503 is coupled to the control terminal of the transistor 504, the output of the clock generation circuitry 104 of FIG. 1 via the CLK terminal, and the control terminals of the transistors 314, 316 via the CLK terminal. The first current terminal of the transistor 503 is coupled to a supply voltage terminal. The second current terminal of the transistor 503 is coupled to the first current terminal of the transistor 504 and the control terminals of the transistors 206, 214, 306 via the CLKZ terminal. The control terminal of the transistor 504 is coupled to the control terminal of the transistor 503, the output of the clock generation circuitry 104 of FIG. 1 via the CLK terminal, and the control terminals of the transistors 314, 316 via the CLK terminal. The first control terminal of the transistor 504 is coupled to the second current terminal of the transistor 503 and the control terminals of the transistors 206, 214, 306 via the CLKZ terminal. The second current terminal of the transistor 504 is coupled to the ground terminal.

The logic gate 506 of FIG. 5 is a logic OR gate. For example, logic gate 508 is a logic NOR gate and the inverter 228 operates as a NOT gate. Thus, the logic gate 506 operates an OR gate to perform a logic OR function based on the master clock signal at the CLK terminal and the test enable signal at the TE terminal. Thus, the CLKB output is based on a logic OR of the master clock signal and the test enable signal.

The transistors 510, 512 of FIG. 5 are p-channel transistors (e.g., p-channel metal oxide semiconductor (PMOS) field effect transistors (FETs)) connected in series. The transistors 510, 512 each include a control terminal and two current terminals. The control terminal of the transistor 510 is coupled to the clock generation circuitry 104 via the CLK terminal. The first current terminal of the transistor 510 is coupled to a supply voltage terminal. The second current terminal of the transistor 510 is coupled to the first current terminal of the transistor 512. The control terminal of the transistor 512 is coupled to the clock control circuitry 102 via the TE terminal. The first current terminal of the transistor 512 is coupled to the second current terminal of the transistor 510. The second current terminal of the transistor 512 is coupled to the first current terminals of the transistors 514, 516 and the input of the inverter 228. The transistors 510, 512 operate as switches (e.g., voltage controlled current switches). For example, if the voltage at the control terminal of the transistor 510 is a logic low voltage (e.g., 0 Volts (V)), the transistor 510 is enabled and operates as a closed switch to short the connection from the first current terminal of the transistor 510 to the second current terminal of the transistor 510. Also, if the voltage at the control terminal of the transistor 510 is a logic high voltage (e.g., 5 Volts (V)), the transistor 510 is disabled and operates as an open switch to open/disconnect the connection from the first current terminal of the transistor 510 to the second current terminal of the transistor 510. Likewise, if the voltage at the control terminal of the transistor 512 is a logic low voltage (e.g., 0 Volts (V)), the transistor 512 is enabled and operates as a closed switch to short the connection from the first current terminal of the transistor 512 to the second current terminal of the transistor 512. Also, if the voltage at the control terminal of the transistor 512 is a logic high voltage (e.g., 5 Volts (V)), the transistor 512 disables and operates as an open switch to open/disconnect the connection from the first current terminal of the transistor 512 to the second current terminal of the transistor 512.

The transistors 514, 516 of FIG. 5 are n-channel transistors (e.g., p-channel metal oxide semiconductor (NMOS) field effect transistors (FETs)). The transistors 514, 516 are connected in parallel. The transistors 514, 516 each include a control terminal and two current terminals. The control terminal of the transistor 514 is coupled to the clock control circuitry 102 via the TE terminal. The first current terminal of the transistor 514 is coupled to the second current terminal of the transistor 512, the first current terminal of the transistor 516, and the input of the inverter 228. The second current terminal of the transistor 514 is coupled to the ground terminal. The control terminal of the transistor 516 is coupled to the clock generating circuitry 104 via the CLK terminal. The first current terminal of the transistor 516 is coupled to the second current terminal of the transistor 512, the first current terminal of the transistor 514, and the input of the inverter 228. The second current terminal of the transistor 514 is coupled to the ground terminal. The transistors 514, 516 operate as switches (e.g., voltage controlled current switches). For example, if the voltage at the control terminal of the transistor 514 is a logic high voltage (e.g., 5 Volts (V)), the transistor 514 is enabled and operates as a closed switch to short the connection from the first current terminal of the transistor 514 to the second current terminal of the transistor 514. Also, if the voltage at the control terminal of the transistor 514 is a logic low voltage (e.g., 0 Volts (V)), the transistor 514 is disabled and operates as an open switch to open/disconnect the connection from the first current terminal of the transistor 514 to the second current terminal of the transistor 514. Likewise, if the voltage at the control terminal of the transistor 516 is a logic high voltage (e.g., 5 Volts (V)), the transistor 516 is enabled and operates as a closed switch to short the connection from the first current terminal of the transistor 516 to the second current terminal of the transistor 516. Also, if the voltage at the control terminal of the transistor 516 is a logic low voltage (e.g., 0 Volts (V)), the transistor 516 disables and operates as an open switch to open/disconnect the connection from the first current terminal of the transistor 516 to the second current terminal of the transistor 516.

Figure 6:
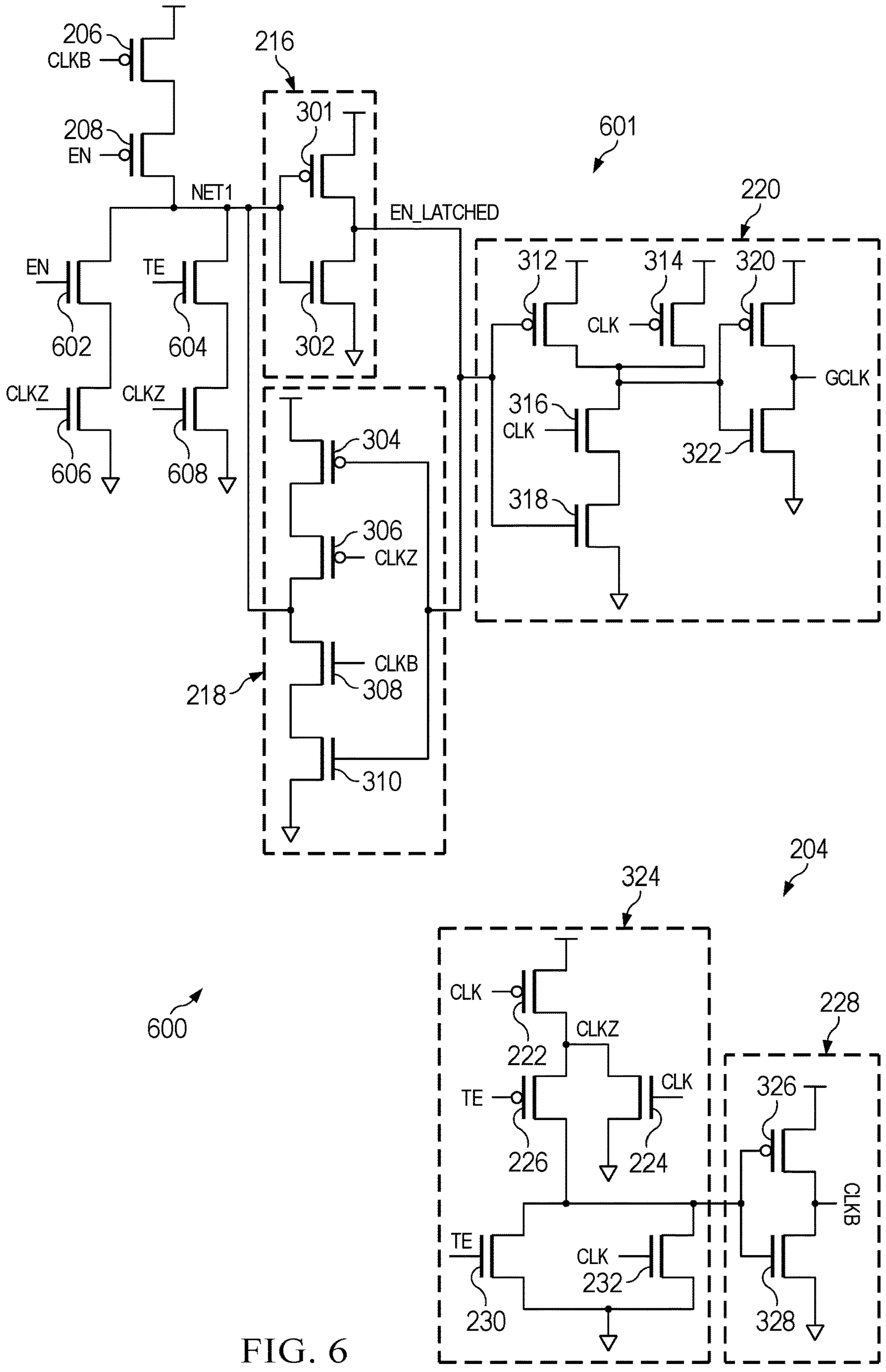
FIG. 6 is an alternative level circuit diagram of the clock gating circuitry of FIG. 1.

FIG. 6 illustrates an alternative circuit implementation of the clock gating circuitry 106 of FIG. 1. The clock gating circuitry 600 of FIG. 6 includes the clock signal generation portion 204 of FIGS. 2 and 3. However, in FIG. 6, the clock gating portion 201 of FIGS. 2 and 3 is replaced with an alternative example clock gating portion 601. The example clock gating portion 601 includes example transistors 602, 604, 606, 608. In the clock gating portion 601 of FIG. 6, the transistor 214 of FIGS. 2-3 is replaced with the two transistors 606, 608, thereby corresponding to the same operation as the transistor 214 but with two transistors instead of one transistor.

The transistors 602, 604, 606, 608 of FIG. 2 are n-channel transistors (e.g., p-channel metal oxide semiconductor (NMOS) field effect transistors (FETs)). The transistors 602, 604 are connected in parallel. The transistors 602, 604, 606, 608 each include a control terminal and two current terminals. The control terminal of the transistor 602 is coupled to the clock control circuitry 102 via the EN terminal. The first current terminal of the transistor 602 is coupled to the second current terminal of the transistor 208, the first current terminal of the transistor 604, the output terminal of the tristate inverter 218, and the input of the inverter 216. The second current terminal of the transistor 602 is coupled to the first current terminal of the transistor 606. The control terminal of the transistor 604 is coupled to the clock control circuitry 102 via the TE terminal. The first current terminal of the transistor 604 is coupled to the second current terminal of the transistor 208, the first current terminal of the transistor 602, the output terminal of the tristate inverter 218, and the input of the inverter 216. The second current terminal of the transistor 604 is coupled to the first current terminal of the transistor 608. The control terminal of the transistor 606 is coupled to the second current terminal of the transistor 222, the control terminal of the transistor 608, the first current terminal of the transistor 224, and the first current terminal of the transistor 226 via the CLKZ terminal. The first current terminal of the transistor 606 is coupled to the second current terminal of the transistor 602. The second current terminal of the transistor 606 is coupled to a ground terminal. The control terminal of the transistor 608 is coupled to the second current terminal of the transistor 222, the control terminal of the transistor 606, the first current terminal of the transistor 224, and the first current terminal of the transistor 226 via the CLKZ terminal. The first current terminal of the transistor 608 is coupled to the second current terminal of the transistor 604. The second current terminal of the transistor 608 is coupled to a ground terminal. The transistors 602, 604, 606, 608 operate as switches (e.g., voltage controlled current switches). For example, if the voltage at the control terminal of the transistor 602 is a logic high voltage (e.g., 5 Volts (V)), the transistor 602 is enabled and operates as a closed switch to short the connection from the first current terminal of the transistor 602 to the second current terminal of the transistor 602. Also, if the voltage at the control terminal of the transistor 602 is a logic low voltage (e.g., 0 Volts (V)), the transistor 602 is disabled and operates as an open switch to open/disconnect the connection from the first current terminal of the transistor 602 to the second current terminal of the transistor 602. Likewise, if the voltage at the control terminal of the transistor 604 is a logic high voltage (e.g., 5 Volts (V)), the transistor 604 is enabled and operates as a closed switch to short the connection from the first current terminal of the transistor 604 to the second current terminal of the transistor 604. Also, if the voltage at the control terminal of the transistor 604 is a logic low voltage (e.g., 0 Volts (V)), the transistor 604 disables and operates as an open switch to open/disconnect the connection from the first current terminal of the transistor 604 to the second current terminal of the transistor 604. Likewise, if the voltage at the control terminal of the transistors 606, 608 is a logic high voltage (e.g., 5 Volts (V)), the transistors 606, 608 are enabled and operate as closed switches to short the connection from the first current terminal of the respective transistor 606, 608 to the second current terminal of the respective transistor 606, 608. Also, if the voltage at the control terminals of the respective transistor 606, 608 is a logic low voltage (e.g., 0 Volts (V)), the transistors 606, 608 disable and operate as open switches to open/disconnect the connection from the first current terminal of the respective transistor 606, 608 to the second current terminal of the respective transistor 606, 608. Accordingly, if the transistors 606, 608 and one or both of the transistors 602, 604 are enabled, the voltage at the input terminal of the inverter 216 is a logic low voltage, because the transistors 606, 608 and one or both of the transistors 602, 604 operate as closed switches to provide a path between ground and the input of the inverter 216.

In some examples, portions of the example implementation of the clock gating circuitry 106, 200, 300, 500, 600 of FIGS. 2-3 and 5-6 may be exchanged, combined, or removed to generate alternative implementations with the same functionality.

An example manner of implementing the computing device 100 is illustrated in FIG. 1 and an example manner of implementing the clock gating circuitry 106, 200, 300, 500, 600 of FIG. 1 is illustrated in FIGS. 2-3 and 5-6. However, one or more of the elements, processes or devices illustrated in FIGS. 1-3 and 4-5 may be combined, divided, re-arranged, omitted, eliminated, or implemented in any other way.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

Descriptors “first,” “second,” “third,” etc. are used herein when identifying multiple elements or components which may be referred to separately. Unless otherwise specified or known based on their context of use, such descriptors do not impute any meaning of priority, physical order, or arrangement in a list, or ordering in time but are merely used as labels for referring to multiple elements or components separately for case of understanding the described examples. In some examples, the descriptor “first” may be used to refer to an element in the detailed description, while the same element may be referred to in a claim with a different descriptor such as “second” or “third.” In such instances, such descriptors are used merely for ease of referencing multiple elements or components.

In the description and in the claims, the terms “including” and “having,” and variants thereof are to be inclusive in a manner similar to the term “comprising” unless otherwise noted. Unless otherwise stated, “about,” “approximately,” or “substantially” preceding a value means+/−10 percent of the stated value. In another example, “about,” “approximately,” or “substantially” preceding a value means+/−5 percent of the stated value. IN another example, “about,” “approximately,” or “substantially” preceding a value means+/−1 percent of the stated value.

In the description and in the claims, “circuitry” may include one or more circuits.

The terms “couple,” “coupled,” “couples,” and variants thereof, as used herein, may cover connections, communications, or signal paths that enable a functional relationship consistent with this description. For example, if device A generates a signal to control device B to perform an action, if a first example device A is coupled to device B, or if a second example device A is coupled to device B through intervening component C if intervening component C does not substantially alter the functional relationship between device A and device B, such that device B is controlled by device A via the control signal generated by device A. Moreover, the terms “couple,” “coupled”, “couples”, or variants thereof, includes an indirect or direct electrical or mechanical connection.

A device that is “configured to” perform a task or function may be configured (e.g., at least one of programmed or hardwired) at a time of manufacturing by a manufacturer to perform the function or may be configurable (or re-configurable) by a user after manufacturing to perform the function or other additional or alternative functions. The configuring may be through at least one of firmware or software programming of the device, through a construction or layout of hardware components and interconnections of the device, or a combination thereof.

Although not all separately labeled in FIGS. 1-3, and 5-6, components or elements of systems and circuits illustrated therein have one or more conductors or terminus that allow signals into or out of the components or elements. The conductors or terminus (or parts thereof) may be referred to herein as pins, pads, terminals (including input terminals, output terminals, reference terminals, and ground terminals, for instance), inputs, outputs, nodes, and interconnects.

As used herein, a “terminal” of a component, device, system, circuit, integrated circuit, or other electronic or semiconductor component, generally refers to a conductor such as a wire, trace, pin, pad, or other connector or interconnect that enables the component, device, system, etc., to electrically or mechanically connect to another component, device, system, etc. A terminal may be used, for instance, to receive or provide analog or digital electrical signals (or simply signals) or to electrically connect to a common or ground reference. Accordingly, an input terminal or input is used to receive a signal from another component, device, system, etc. An output terminal or output is used to provide a signal to another component, device, system, etc. Other terminals may be used to connect to a common, ground, or voltage reference, e.g., a reference terminal or ground terminal. A terminal of an IC or a PCB may also be referred to as a pin (a longitudinal conductor) or a pad (a planar conductor). A node refers to a point of connection or interconnection of two or more terminals. An example number of terminals and nodes may be shown. However, depending on a particular circuit or system topology, there may be more or fewer terminals and nodes. However, in some instances, “terminal,” “node,” “interconnect,” “pad,” and “pin” may be used interchangeably.

The term “or” when used, for example, in a form such as A, B, or C refers to any combination or subset of A, B, C such as (1) A alone, (2) B alone, (3) C alone, (4) A with B, (5) A with C, (6) B with C, or (7) A with B and with C.

Example methods, apparatus, systems, and articles of manufacture to perform clock gating are described herein. Further examples and combinations thereof include the following: Example 1 includes an apparatus comprising a first transistor including a control terminal, a first terminal, and a second terminal, a second transistor including a control terminal, a first terminal, and a second terminal, the first terminal of the second transistor coupled to the first terminal of the first transistor, the second terminal of the second transistor coupled to the second terminal of the first transistor, an inverter including an input terminal and an output terminal, the input terminal of the inverter coupled to the first terminal of the first transistor and the first terminal of the second transistor, a tristate inverter including an input terminal and an output terminal, the input terminal of the tristate inverter coupled to the output terminal of the inverter, the output terminal of the tristate inverter coupled to the input terminal of the inverter, the first terminal of the first transistor, and the first terminal of the second transistor, and a logic and gate including a first input terminal, a second input terminal, and an output terminal, the first input terminal of the logic and gate coupled to the output terminal of the inverter and the input terminal of the tristate inverter, and the second input terminal coupled to clock generation circuitry.

Example 2 includes the apparatus of example 1, further including a p-channel transistor including a control terminal, a first terminal, and a second terminal, the control terminal of the p-channel transistor coupled to the clock generation circuitry, the first terminal of the p-channel transistor coupled to a supply voltage terminal, wherein the control terminal of the p-channel transistor is coupled to receive a first clock signal and the output terminal of the logic and gate is configured to provide a second clock signal based on the first clock signal.

Example 3 includes the apparatus of example 2, wherein the input terminal of the tristate inverter is a first input terminal, the tristate inverter further including a second input terminal coupled to the second terminal of the p-channel transistor.

Example 4 includes the apparatus of example 2, further including a third transistor including a control terminal, a first terminal, and a second terminal, the control terminal of the third transistor coupled to the second terminal of the p-channel transistor, the first terminal of the third transistor coupled to the second terminal of the first transistor and the second terminal of the second transistor, the second terminal of the third transistor coupled to a ground terminal.

Example 5 includes the apparatus of example 2, wherein the p-channel transistor is a first p-channel transistor and the inverter is a first inverter, further including a second p-channel transistor including a control terminal, a first terminal, and a second terminal, the control terminal of the second p-channel transistor coupled to clock control circuitry, the first terminal of the second p-channel transistor coupled to the second terminal of the first p-channel transistor, a third transistor including a control terminal, a first terminal, and a second terminal, the control terminal of the third transistor coupled to the clock control circuitry, the first terminal of the third transistor coupled to the second terminal of the second p-channel transistor, the second terminal of the third transistor coupled to a ground terminal, a fourth transistor including a control terminal, a first terminal, and a second terminal, the control terminal of the fourth transistor coupled to the clock generation circuitry, the first terminal of the fourth transistor coupled to the second terminal of the second p-channel transistor and the first terminal of the third transistor, the second terminal of the fourth transistor coupled to the ground terminal, a second inverter including an input terminal and an output terminal, the input terminal of the second inverter coupled to the second terminal of the second p-channel transistor, the first terminal of the third transistor, and the first terminal of the fourth transistor, and a fifth transistor including a control terminal, a first terminal, and a second terminal, the control terminal of the fifth transistor coupled to the clock generation circuitry, the first terminal of the fifth transistor coupled to the second terminal of the first p-channel transistor, the first terminal of the second p-channel transistor, the second terminal of the fifth transistor coupled to the ground terminal.

Example 6 includes the apparatus of example 5, wherein the input terminal of the tristate inverter is a first input terminal, the tristate inverter further including a second input terminal and a third input terminal, the second input terminal coupled to the second terminal of the first p-channel transistor, the first terminal of the second p-channel transistor, and the first terminal of the fifth transistor, the third input terminal coupled to the output terminal of the second inverter.

Example 7 includes the apparatus of example 5, further including a third p-channel transistor including a control terminal, a first terminal, and a second terminal, the control terminal of the third p-channel transistor coupled to the output terminal of the second inverter, the first terminal of the third p-channel transistor coupled to the supply voltage terminal, and a fourth p-channel transistor including a control terminal, a first terminal, and a second terminal, the control terminal of the fourth p-channel transistor coupled to the clock control circuitry, the first terminal of the fourth p-channel transistor coupled to the second terminal of the third p-channel transistor, the second terminal of the fourth p-channel transistor coupled to the first terminal of the first transistor, the first terminal of the second transistor, the input terminal of the first inverter, and the output terminal of the tristate inverter.

Example 8 includes the apparatus of example 1, wherein the control terminal of the first transistor is coupled to clock control circuitry via a first connection and the control terminal of the second transistor is coupled to the clock control circuitry via a second connection.

Example 9 includes an apparatus comprising a first p-channel transistor including a control terminal, a first terminal, and a second terminal, the control terminal of the first p-channel transistor coupled to clock generation circuitry, the first terminal of the first p-channel transistor coupled to a supply voltage terminal, a second p-channel transistor including a control terminal, a first terminal, and a second terminal, the control terminal of the second p-channel transistor coupled to clock control circuitry via a first connection, the first terminal of the second p-channel transistor coupled to the second terminal of the first p-channel transistor, a first transistor including a control terminal, a first terminal, and a second terminal, the control terminal of the first transistor coupled to the clock control circuitry via the first connection, the first terminal of the first transistor coupled to the second terminal of the second p-channel transistor, the second terminal of the first transistor coupled to a ground terminal, a second transistor including a control terminal, a first terminal, and a second terminal, the control terminal of the second transistor coupled to the clock generation circuitry, the first terminal of the second transistor coupled to the second terminal of the second p-channel transistor and the first terminal of the first transistor, the second terminal of the second transistor coupled to the ground terminal, and an inverter including an input terminal and an output terminal, the input terminal of the inverter coupled to the second terminal of the second p-channel transistor, the first terminal of the first transistor, and the first terminal of the second transistor.

Example 10 includes the apparatus of example 9, further including a third transistor including a control terminal, a first terminal, and a second terminal, the control terminal of the third transistor coupled to the clock generation circuitry, the first terminal of the third transistor coupled to the second terminal of the first p-channel transistor, the second terminal of the third transistor coupled to the ground terminal, the control terminal of the second transistor and the control terminal of the third transistor to receive a first clock signal.

Example 11 includes the apparatus of example 9, wherein the inverter is a first inverter, further including a third transistor including a control terminal, a first terminal, and a second terminal, the control terminal coupled to the clock control circuitry via a second connection, a fourth transistor including a control terminal, a first terminal, and a second terminal, the control terminal coupled to the clock control circuitry via the first connection, the first terminal of the fourth transistor coupled to the first terminal of the third transistor, the second terminal of the fourth transistor coupled to the second terminal of the third transistor, a second inverter including an input terminal and an output terminal, the input terminal of the second inverter coupled to the first terminal of the third transistor and the first terminal of the fourth transistor, a tristate inverter including a first input terminal, a second input terminal, a third input terminal, and an output terminal, the first input terminal of the tristate inverter coupled to the output terminal of the second inverter, the second input terminal of the tristate inverter coupled to the second terminal of the first p-channel transistor and the first terminal of the second p-channel transistor, the third input terminal of the tristate inverter coupled to the output terminal of the first inverter, the output terminal of the tristate inverter coupled to the input terminal of the second inverter, the first terminal of the third transistor, and the first terminal of the fourth transistor, and a logic and gate including a first input terminal, a second input terminal, and an output terminal, the first input terminal of the logic and gate coupled to the output terminal of the second inverter and the input terminal of the tristate inverter, and the second input terminal coupled to the clock generation circuitry, the output terminal of the logic and gate structured to output second clock signal based on a first clock signal output by the clock generation circuitry.

Example 12 includes the apparatus of example 11, further including a fifth transistor including a control terminal, a first terminal, and a second terminal, the control terminal of the fifth transistor coupled to the second terminal of the first p-channel transistor, the first terminal of the fifth transistor coupled to the second terminal of the third transistor and the second terminal of the fourth transistor, the second terminal of the fifth transistor coupled to the ground terminal.

Example 13 includes the apparatus of example 11, further including a third p-channel transistor including a control terminal, a first terminal, and a second terminal, the control terminal of the third p-channel transistor coupled to the output terminal of the first inverter, the first terminal of the third p-channel transistor coupled to the supply voltage terminal, and a fourth p-channel transistor including a control terminal, a first terminal, and a second terminal, the control terminal of the fourth p-channel transistor coupled to the clock control circuitry via the second connection, the first terminal of the fourth p-channel transistor coupled to the second terminal of the third p-channel transistor, the second terminal of the fourth p-channel transistor coupled to the first terminal of the third transistor, the first terminal of the fourth transistor, the input terminal of the second inverter, and the output terminal of the tristate inverter.

Example 14 includes an apparatus comprising a first transistor including a control terminal, a first terminal, and a second terminal, a second transistor including a control terminal, a first terminal, and a second terminal, the first terminal of the second transistor coupled to the first terminal of the first transistor, the second terminal of the second transistor coupled to the second terminal of the first transistor, a first p-channel transistor including a control terminal, a first terminal, and a second terminal, the control terminal of the first p-channel transistor coupled to the first terminal of the first transistor and the first terminal of the second transistor, the first terminal of the first p-channel transistor coupled to a supply terminal, a third transistor including a control terminal, a first terminal, and a second terminal, the control terminal of the third transistor coupled to the first terminal of the first transistor, the first terminal of the second transistor, and the control terminal of the first p-channel transistor, the first terminal of the third transistor coupled to the second terminal of the first p-channel transistor, the second terminal of the third transistor coupled to a ground terminal, a second p-channel transistor including a control terminal, a first terminal, and a second terminal, the control terminal of the second p-channel transistor coupled to the second terminal of the first p-channel transistor and the first terminal of the third transistor, the first terminal of the second p-channel transistor coupled to the supply terminal, a third p-channel transistor including a control terminal, a first terminal, and a second terminal, the first terminal of the third p-channel transistor coupled to the second terminal of the second p-channel transistor, the second terminal of the third p-channel transistor coupled to the first terminal of the first transistor, the first terminal of the second transistor, the control terminal of the first p-channel transistor, and the control terminal of the third transistor, a fourth transistor including a control terminal, a first terminal, and a second terminal, the first terminal of the fourth transistor coupled to the second terminal of the third p-channel transistor, the first terminal of the first transistor, the first terminal of the second transistor, the control terminal of the first p-channel transistor, and the control terminal of the third transistor, and a fifth transistor including a control terminal, a first terminal, and a second terminal, the control terminal of the fifth transistor coupled to the control terminal of the second p-channel transistor, the second terminal of the first p-channel transistor, and the first terminal of the third transistor, the first terminal of the fifth transistor coupled to the second terminal of the fourth transistor, the second terminal of the fifth transistor coupled to the ground terminal.

Example 15 includes the apparatus of example 14, further including a fourth p-channel transistor including a control terminal, a first terminal, and a second terminal, the control terminal of the fourth p-channel transistor coupled to the second terminal of the first p-channel transistor, the first terminal of the third transistor, the control terminal of the second p-channel transistor, and the control terminal of the fifth transistor, the first terminal of the fourth p-channel transistor coupled to the supply terminal, a fifth p-channel transistor including a control terminal, a first terminal, and a second terminal, the control terminal of the fifth p-channel transistor coupled to clock generation circuitry, the first terminal of the fifth p-channel transistor coupled to the supply terminal, the second terminal of the fifth p-channel transistor coupled to the second terminal of the fourth p-channel transistor, a sixth transistor including a control terminal, a first terminal, and a second terminal, the control terminal of the sixth transistor coupled to the clock generation circuitry, the first terminal of the sixth transistor coupled to the second terminal of the fourth p-channel transistor and the second terminal of the fifth p-channel transistor, a seventh transistor including a control terminal, a first terminal, and a second terminal, the control terminal of the seventh transistor coupled to the control terminal of the fourth p-channel transistor, the second terminal of the first p-channel transistor, the first terminal of the third transistor, the control terminal of the second p-channel transistor, and the control terminal of the fifth transistor, the first terminal of the seventh transistor coupled to the second terminal of the sixth transistor, and the second terminal of the seventh transistor coupled to the ground terminal, a sixth p-channel transistor including a control terminal, a first terminal, and a second terminal, the control terminal of the sixth p-channel transistor coupled to the second terminal of the fourth p-channel transistor, the second terminal of the fifth p-channel transistor, and the first terminal of the sixth transistor, the first terminal of the sixth p-channel transistor coupled to the supply terminal, and an eighth transistor including a control terminal, a first terminal, and a second terminal, the control terminal of the eighth transistor coupled to the control terminal of the sixth p-channel transistor, the second terminal of the fourth p-channel transistor, the second terminal of the fifth p-channel transistor, and the first terminal of the sixth transistor, the first terminal of the eighth transistor coupled to the second terminal of the sixth p-channel transistor, and the second terminal of the eighth transistor coupled to the ground terminal.

Example 16 includes the apparatus of example 14, further including a seventh p-channel transistor including a control terminal, a first terminal, and a second terminal, the control terminal of the seventh p-channel transistor coupled to clock generation circuitry, the first terminal of the seventh p-channel transistor coupled to a supply voltage terminal, the second terminal of the seventh p-channel transistor coupled to the control terminal of the third p-channel transistor and the control terminal of the fourth transistor.

Example 17 includes the apparatus of example 16, further including a sixth transistor including a control terminal, a first terminal, and a second terminal, the control terminal of the sixth transistor coupled to the second terminal of the seventh p-channel transistor, the first terminal of the sixth transistor coupled to the second terminal of the first transistor and the second terminal of the second transistor, the second terminal of the sixth transistor coupled to the ground terminal.

Example 18 includes the apparatus of example 16, further including a fourth p-channel transistor including a control terminal, a first terminal, and a second terminal, the control terminal of the fourth p-channel transistor coupled to clock control circuitry, the first terminal of the fourth p-channel transistor coupled to the second terminal of the first p-channel transistor, a sixth transistor including a control terminal, a first terminal, and a second terminal, the control terminal of the sixth transistor coupled to the clock control circuitry, the first terminal of the sixth transistor coupled to the second terminal of the fourth p-channel transistor, the second terminal of the sixth transistor coupled to the ground terminal, a seventh transistor including a control terminal, a first terminal, and a second terminal, the control terminal of the seventh transistor coupled to the clock generation circuitry, the first terminal of the seventh transistor coupled to the second terminal of the second p-channel transistor and the first terminal of the sixth transistor, the second terminal of the seventh transistor coupled to the ground terminal, and an inverter including an input terminal and an output terminal, the input terminal of the inverter coupled to the second terminal of the fourth p-channel transistor, the first terminal of the sixth transistor, and the first terminal of the seventh transistor.

Example 19 includes the apparatus of example 18, wherein the output terminal of the inverter is coupled to the control terminal of the third p-channel transistor and the control terminal of the fourth transistor.

Example 20 includes the apparatus of example 18, wherein the inverter includes a fifth p-channel transistor including a control terminal, a first terminal, and a second terminal, the control terminal of the fifth p-channel transistor coupled to the input terminal of the inverter, the first terminal of the fifth p-channel transistor coupled to the supply terminal, the second terminal of the fifth p-channel transistor coupled to the output terminal of the inverter, and an eighth transistor including a control terminal, a first terminal, and a second terminal, the control terminal of the eighth transistor coupled to the control terminal of the fifth p-channel transistor and the input terminal of the inverter, the first terminal of the eighth transistor coupled to the second terminal of the fifth p-channel transistor and the output terminal of the inverter, the second terminal of the eighth transistor coupled to the ground terminal.

Modifications are possible in the described examples, and other examples are possible, within the scope of the claims.

What is claimed is:

1. An apparatus comprising:

a first transistor including a control terminal, a first terminal, and a second terminal;

a second transistor including a control terminal, a first terminal, and a second terminal, the first terminal of the second transistor coupled to the first terminal of the first transistor, the second terminal of the second transistor coupled to the second terminal of the first transistor;

a first inverter including an input terminal and an output terminal, the input terminal of the first inverter coupled to the first terminal of the first transistor and the first terminal of the second transistor;

a tristate inverter including a first input terminal, a second input terminal, a third input terminal, and an output terminal, the first input terminal of the tristate inverter coupled to the output terminal of the first inverter, the output terminal of the tristate inverter coupled to the input terminal of the first inverter, the first terminal of the first transistor, and the first terminal of the second transistor;

a logic gate including a first input terminal, a second input terminal, and an output terminal, the first input terminal of the logic and gate coupled to the output terminal of the first inverter and the input terminal of the tristate inverter, and the second input terminal coupled to clock generation circuitry;

a third transistor including a control terminal, a first terminal, and a second terminal, the second terminal of the third transistor coupled to the second input terminal of the tristate inverter;

a fourth transistor including a control terminal, a first terminal, and a second terminal, the first terminal of the fourth transistor coupled to the second terminal of the of the third transistor;

a fifth transistor including a control terminal, a first terminal, and a second terminal, the first terminal of the fifth transistor coupled to the second terminal of the fourth transistor;

a sixth transistor including a control terminal, a first terminal, and a second terminal, the first terminal of the sixth transistor coupled to the first terminal of the fifth transistor and the second terminal of the sixth transistor coupled to the second terminal of the fifth transistor; and a second inverter including an input terminal and an output terminal; the input terminal of the second inverter coupled to the first terminal of the fifth transistor and the first terminal of the sixth transistor, and the output terminal of the second inverter coupled to the third input terminal of the tristate inverter.

2. The apparatus of claim 1, further including:

a seventh transistor including a control terminal, a first terminal, and a second terminal, the control terminal of the seventh transistor coupled to the clock generation circuitry, the first terminal of the seventh transistor coupled to the second terminal of the third transistor and the first terminal of the fourth transistor, the second terminal of the seventh transistor coupled to a ground terminal.

3. The apparatus of claim 1, wherein the control terminal of the first transistor is coupled to clock control circuitry via a first connection and the control terminal of the second transistor is coupled to the clock control circuitry via a second connection.

4. The apparatus of claim 1, further comprising:

an eighth transistor including a first terminal, a second terminal, and a control terminal, the second terminal of the eighth transistor coupled to the first terminal of the first transistor and to the first terminal of the second transistor;

a ninth transistor including a first terminal, a second terminal, and a control terminal, the second terminal of the ninth transistor coupled to the first terminal of the eighth transistor and the control terminal of the ninth transistor coupled to the output terminal of the second inverter; and a twenty-second transistor including a first terminal, a second terminal, and a control terminal, the first terminal of the twenty-second transistor coupled to the second terminal of the first transistor and the second terminal of the second terminal, and the control terminal of the twenty-second transistor coupled to the second terminal of the third transistor.

5. The apparatus of claim 1, wherein the tristate inverter comprises:

a tenth transistor including a first terminal, a second terminal, and a control terminal, the control terminal of the tenth transistor coupled to the first input terminal of the tristate inverter;

an eleventh transistor including a first terminal, a second terminal, and a control terminal, the first terminal of the eleventh transistor coupled to the second terminal of the tenth transistor, the second terminal of the eleventh transistor coupled to the output terminal of the tristate inverter, and the control terminal of the eleventh transistor coupled to the second input terminal of the tristate inverter;

a twelfth transistor including a first terminal, a second terminal, and a control terminal, the first terminal of the twelfth transistor coupled to the second terminal of the eleventh transistor and to the output terminal of the tristate inverter, and the control terminal of the twelfth transistor coupled to the third input terminal of the tristate inverter; and a thirteenth transistor including a first terminal, a second terminal, and a control terminal, the first terminal coupled to the second terminal of the twelfth transistor and the control terminal of the thirteenth transistor coupled to the first input terminal of the tristate inverter.

6. The apparatus of claim 1, wherein the first inverter comprises:

a fourteenth transistor including a first terminal, a second terminal, and a control terminal, the control terminal coupled to the input terminal of the first inverter and the second terminal coupled to the output terminal of the first inverter; and a fifteenth transistor including a first terminal, a second terminal, and a control terminal, the first terminal coupled to the second terminal of the fourteenth transistor and to the output terminal of the first inverter, and the control terminal of the fifteenth transistor coupled to the control terminal of the fourteenth transistor and to the input terminal of the first inverter.

7. The apparatus of claim 1, wherein the logic gate is an AND gate, and wherein the AND gate comprises:

a sixteenth transistor including a first terminal, a second terminal, and a control terminal, the control terminal of the sixteenth transistor coupled to the first input terminal of the AND gate;

a seventeenth transistor including a first terminal, a second terminal, and a control terminal, the first terminal of the seventeenth transistor coupled to the second terminal of the sixteenth transistor;

an eighteenth transistor including a first terminal, a second terminal, and a control terminal, the first terminal of the eighteenth transistor coupled to the second terminal of the seventeenth transistor and the control terminal of the eighteenth transistor coupled to the first input terminal of the AND gate;

a nineteenth transistor including a first terminal, a second terminal, and a control terminal, the second terminal of the nineteenth transistor coupled to the second terminal of the sixteenth transistor, and the control terminal of the nineteenth transistor coupled to the second input terminal of the AND gate;

a twentieth transistor including a first terminal, a second terminal, and a control terminal, the control terminal of the twentieth transistor coupled to the second terminal of the sixteenth transistor, and the second terminal of the twentieth transistor coupled to the output terminal of the AND gate; and a twenty-first transistor including a first terminal, a second terminal, ad a control terminal, the first terminal of the twenty-first transistor coupled to the second terminal of the twentieth transistor and to the output terminal of the AND gate, and the control terminal of the twenty-first transistor coupled to the first terminal of the sixteenth transistor.

8. The apparatus of claim 1, wherein the control terminal of the third transistor is configured to receive a first clock signal, the control terminal of the fourth transistor is configured to receive a test enable signal, the control terminal of the fifth transistor is configured to receive the test enable signal, the control terminal of the sixth transistor is configured to receive the first clock signal, the control terminal of the first transistor is configured to receive an enable signal, the control terminal of the second transistor is configured to receive the test enable signal, and the output terminal of the logic gate is configured to produce a second clock signal.

9. A circuit comprising:

a clock signal generation circuit configured to:

receive a first clock signal;

receive a test enable signal;

produce a second clock signal that is an inverse of the first clock signal; and produce a third clock signal that is an OR of the first clock signal and the test enable signal; and a gating circuit coupled to the clock signal generation circuit, the gating circuit comprising:

an inverter including an input terminal and an output terminal;

a tristate inverter including a first input terminal, a second input terminal, a third input terminal, and an output terminal, the first input coupled to the output of the inverter, the second input configured to receive the second clock signal, the third input configured to receive the third clock signal, and the output coupled to the input of the inverter; and a logic gate including a first input and a second input, the first input coupled to the output of the inverter and the second input configured to receive the first clock signal.

10. The circuit of claim 9, wherein the gating circuit further comprises:

a first transistor including a first terminal, a second terminal, and a control terminal, the first terminal of the first transistor coupled to the output terminal of the tristate inverter, and the control terminal of the first transistor is configured to receive an enable signal;

a second transistor including a first terminal, a second terminal, and a control terminal, the first terminal coupled to the first terminal of the of the first transistor, the second terminal of the second transistor coupled to the second terminal of the first transistor, and the control terminal of the second transistor is configured to receive the test enable signal;

a third transistor including a first terminal, a second terminal, and a control terminal, the second terminal of the third transistor coupled to the first terminal of the first transistor and the control terminal of the third transistor is configured to receive the enable signal;

a fourth transistor including a first terminal, a second terminal, and a control terminal, the second terminal of the fourth transistor coupled to the first terminal of the third transistor, and the control terminal of the fourth transistor is configured to receive the third clock signal; and a fifth transistor including a first terminal, a second terminal, and a control terminal, wherein the first terminal of the fifth transistor is coupled to the second terminal of the first transistor, and the control terminal of the fifth transistor is configured to receive the second clock signal.

11. The circuit of claim 9, wherein the gating circuit further comprises:

a first transistor including a first terminal, a second terminal, and a control terminal, the first terminal of the first transistor coupled to the output terminal of the tristate inverter, and the control terminal of the first transistor is configured to receive an enable signal;

a second transistor including a first terminal, a second terminal, and a control terminal, the first terminal coupled to the first terminal of the of the first transistor, and the control terminal of the second transistor is configured to receive the test enable signal;

a third transistor including a first terminal, a second terminal, and a control terminal, the second terminal of the third transistor coupled to the first terminal of the first transistor and the control terminal of the third transistor is configured to receive the enable signal;

a fourth transistor including a first terminal, a second terminal, and a control terminal, the second terminal of the fourth transistor coupled to the first terminal of the third transistor, and the control terminal of the fourth transistor is configured to receive the third clock signal;

a fifth transistor including a first terminal, a second terminal, and a control terminal, wherein the first terminal of the fifth transistor is coupled to the second terminal of the first transistor, and the control terminal of the fifth transistor is configured to receive the second clock signal; and an eleventh transistor including a first terminal, a second terminal, and a control terminal, the first terminal of the eleventh transistor coupled to the second terminal of the second transistor, and the control terminal of the eleventh transistor is configured to receive the third clock signal.

12. The circuit of claim 9, wherein the inverter is a first inverter, and the clock signal generation circuit comprises:

a sixth transistor including a first terminal, a second terminal, and a control terminal, the control terminal of the sixth transistor configured to receive the first clock signal and the second terminal of the sixth transistor configured to produce the second clock signal.

13. The circuit of claim 12, further comprising:

a seventh transistor including a first terminal, a second terminal, and a control terminal, the first terminal of the seventh transistor coupled to the second terminal of the sixth transistor, and the control terminal of the seventh transistor is configured to receive the test enable signal;

an eighth transistor including a first terminal, a second terminal, and a control terminal, the first terminal of the eighth transistor coupled to the second terminal of the seventh transistor, and the control terminal of the eighth transistor is configured to receive the test enable signal;

a ninth transistor including a first terminal, a second terminal, and a control terminal, the first terminal of the ninth transistor coupled to the first terminal of the eighth transistor, and the control terminal of the ninth transistor is configured to receive the first clock signal;

a tenth transistor including a first terminal, a second terminal, and a control terminal, the first terminal coupled to the second terminal of the sixth transistor, and the control terminal of the tenth transistor is configured to receive the first clock signal; and a second inverter having an input terminal and an output terminal, the input terminal of the second inverter coupled to the second terminal of the seventh transistor, and the second inverter is configured to produce the third clock signal at the output terminal.

14. The circuit of claim 9, wherein inverter is a first inverter, and the clock signal generation circuit comprises:

a second inverter including an input terminal and an output terminal, the input terminal of the second inverter configured to receive the first clock signal, and the second inverter configured to produce the second clock signal at the output terminal; and an OR gate including a first input terminal, a second input terminal, and an output terminal, the OR gate configured to:

receive the first clock signal at the first input terminal of the OR gate;

receive the test enable signal at the second input terminal of the OR gate; and output the third clock signal at the output terminal of the OR gate.

15. A device comprising:

gate enabling circuitry configured to produce a test enable signal;

clock generation circuitry configured to produce a first clock signal;

a clock signal generation circuit configured to:

receive the first clock signal;

receive the test enable signal;

produce a second clock signal that is an inverse of the first clock signal; and produce a third clock signal that is an OR of the first clock signal and the test enable signal;

a gating circuit coupled to the clock signal generation circuit, the gating circuit comprising:

an inverter including an input terminal and an output terminal;

a tristate inverter including a first input terminal, a second input terminal, a third input terminal, and an output terminal, the first input coupled to the output of the inverter, the second input configured to receive the second clock signal, the third input configured to receive the third clock signal, and the output coupled to the input of the inverter; and a logic gate including a first input, a second input, and an output, the first input coupled to the output of the inverter and the second input configured to receive the first clock signal, the logic gate configured to produce a fourth clock signal at the output; and processing circuitry configured to receive the fourth clock signal.

16. The device of claim 15, wherein the gating circuit further comprises:

a first transistor including a first terminal, a second terminal, and a control terminal, the first terminal of the first transistor coupled to the output terminal of the tristate inverter, and the control terminal of the first transistor is configured to receive an enable signal;

a second transistor including a first terminal, a second terminal, and a control terminal, the first terminal coupled to the first terminal of the of the first transistor, the second terminal of the second transistor coupled to the second terminal of the first transistor, and the control terminal of the second transistor is configured to receive the test enable signal;

a third transistor including a first terminal, a second terminal, and a control terminal, the second terminal of the third transistor coupled to the first terminal of the first transistor and the control terminal of the third transistor is configured to receive the enable signal;

a fourth transistor including a first terminal, a second terminal, and a control terminal, the second terminal of the fourth transistor coupled to the first terminal of the third transistor, and the control terminal of the fourth transistor is configured to receive the third clock signal; and a fifth transistor including a first terminal, a second terminal, and a control terminal, wherein the first terminal of the fifth transistor is coupled to the second terminal of the first transistor, and the control terminal of the fifth transistor is configured to receive the second clock signal.

17. The device of claim 16, wherein the gating circuit further comprises:

a first transistor including a first terminal, a second terminal, and a control terminal, the first terminal of the first transistor coupled to the output terminal of the tristate inverter, and the control terminal of the first transistor is configured to receive an enable signal;

a second transistor including a first terminal, a second terminal, and a control terminal, the first terminal coupled to the first terminal of the of the first transistor, and the control terminal of the second transistor is configured to receive the test enable signal;

a third transistor including a first terminal, a second terminal, and a control terminal, the second terminal of the third transistor coupled to the first terminal of the first transistor and the control terminal of the third transistor is configured to receive the enable signal;

a fourth transistor including a first terminal, a second terminal, and a control terminal, the second terminal of the fourth transistor coupled to the first terminal of the third transistor, and the control terminal of the fourth transistor is configured to receive the third clock signal;

a fifth transistor including a first terminal, a second terminal, and a control terminal, wherein the first terminal of the fifth transistor is coupled to the second terminal of the first transistor, and the control terminal of the fifth transistor is configured to receive the second clock signal; and an eleventh transistor including a first terminal, a second terminal, and a control terminal, the first terminal of the eleventh transistor coupled to the second terminal of the second transistor, and the control terminal of the eleventh transistor is configured to receive the third clock signal.

18. The device of claim 15, wherein the inverter is a first inverter, and the clock signal generation circuit comprises:

a sixth transistor including a first terminal, a second terminal, and a control terminal, the control terminal of the sixth transistor configured to receive the first clock signal and the second terminal of the sixth transistor configured to produce the second clock signal.

19. The device of claim 18, further comprising:

a seventh transistor including a first terminal, a second terminal, and a control terminal, the first terminal of the seventh transistor coupled to the second terminal of the sixth transistor, and the control terminal of the seventh transistor is configured to receive the test enable signal;

an eighth transistor including a first terminal, a second terminal, and a control terminal, the first terminal of the eighth transistor coupled to the second terminal of the seventh transistor, and the control terminal of the eighth transistor is configured to receive the test enable signal;

a ninth transistor including a first terminal, a second terminal, and a control terminal, the first terminal of the ninth transistor coupled to the first terminal of the eighth transistor, and the control terminal of the ninth transistor is configured to receive the first clock signal;

a tenth transistor including a first terminal, a second terminal, and a control terminal, the first terminal coupled to the second terminal of the sixth transistor, and the control terminal of the tenth transistor is configured to receive the first clock signal; and a second inverter having an input terminal and an output terminal, the input terminal of the second inverter coupled to the second terminal of the seventh transistor, and the second inverter is configured to produce the third clock signal at the output terminal.

20. The device of claim 15, wherein inverter is a first inverter, and the clock signal generation circuit comprises:

a second inverter including an input terminal and an output terminal, the input terminal of the second inverter configured to receive the first clock signal, and the second inverter configured to produce the second clock signal at the output terminal; and an OR gate including a first input terminal, a second input terminal, and an output terminal, the OR gate configured to:

receive the first clock signal at the first input terminal of the OR gate;

receive the test enable signal at the second input terminal of the OR gate; and output the third clock signal at the output terminal of the OR gate.

* * * * *